US011536446B2

(12) United States Patent
Liu et al.

(10) Patent No.: US 11,536,446 B2
(45) Date of Patent: Dec. 27, 2022

(54) ELECTRONIC DEVICE WITH VISUAL FEEDBACK

(71) Applicant: Apple Inc., Cupertino, CA (US)

(72) Inventors: Rong Liu, Sunnyvale, CA (US); Andrew Baek, San Francisco, CA (US); Ethan W. Juhnke, Cupertino, CA (US); Eugene A. Whang, San Francisco, CA (US); Gemma A. Roper, San Francisco, CA (US); Glenn K. Trainer, Santa Clara, CA (US); Jia Chen Pang, San Jose, CA (US); Jun Qi, San Jose, CA (US); Ka Ho P. Poon, San Jose, CA (US); Michael C. Sulkis, San Jose, CA (US); Pedro Mari, Santa Cruz, CA (US); Syed F. Mohiuddin, Santa Clara, CA (US); Victor H. Yin, Cupertino, CA (US); Yu P. Sun, Yorba Linda, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/349,787

(22) Filed: Jun. 16, 2021

(65) Prior Publication Data
US 2022/0042676 A1    Feb. 10, 2022

Related U.S. Application Data

(60) Provisional application No. 63/063,115, filed on Aug. 7, 2020.

(51) Int. Cl.
*F21V 33/00* (2006.01)
*F21V 14/02* (2006.01)
(Continued)

(52) U.S. Cl.
CPC .......... *F21V 33/0056* (2013.01); *F21V 14/02* (2013.01); *F21V 3/049* (2013.01);
(Continued)

(58) Field of Classification Search
CPC ............... F21V 233/0056; F21V 14/02; F21V 33/0056; F21V 2200/00; F21V 3/049; F21Y 2115/10; G06F 3/167
See application file for complete search history.

(56) References Cited

U.S. PATENT DOCUMENTS 3,023,830 A  *  3/1962  Hammes ............. F21V 33/0056
                                                    362/86
7,728,799 B2     6/2010  Kerr
(Continued)

FOREIGN PATENT DOCUMENTS

CN      208850051 U      5/2019
EP        3397033 A1    10/2018
(Continued)

*Primary Examiner* — Diane I Lee
*Assistant Examiner* — Nathaniel J Lee
(74) *Attorney, Agent, or Firm* — Treyz Law Group, P.C.; Jason Tsai

(57) ABSTRACT

An electronic device such as a voice-controlled speaker device may have a housing. A speaker and other input-output components and control circuitry may be mounted within the housing. Light-emitting components may emit light that passes through a curved upper top cap portion or other housing structure. The light-emitting components may be interconnected using a flex circuit on a curved substrate or may be mounted on a planar circuit board. A subset of the light-emitting components may be rotated to improve color balance. Optical structures such as light guides, lens, microlenses, and/or a diffuser layer may be disposed over the light-emitting components to promote light mixing, to reduce hotspots, and to improve contrast on the top cap. The diffuser layer may be suspended using a support structure having baffle members to constraint the angular spread of the emitted light. Illuminated or persistently visible glyphs may be displayed in or near the top cap portion.

22 Claims, 21 Drawing Sheets

(51) Int. Cl.
*F21V 3/04* (2018.01)
*G06F 3/16* (2006.01)
*F21Y 115/10* (2016.01)

(52) U.S. Cl.
CPC ....... *F21V 2200/00* (2015.01); *F21Y 2115/10* (2016.08); *G06F 3/167* (2013.01)

(56) References Cited

U.S. PATENT DOCUMENTS

| | | |
|---|---|---|
| 9,721,586 B1 | 8/2017 | Bay et al. |
| 10,375,471 B2 | 8/2019 | Johnson et al. |
| 10,701,845 B2 | 6/2020 | Schmitt et al. |
| 2008/0298045 A1* | 12/2008 | Wright ................ F21V 33/0056 362/86 |
| 2014/0211122 A1* | 7/2014 | Wurzel ............. G02F 1/133308 445/24 |
| 2014/0347266 A1* | 11/2014 | Kasuga ............... F21V 33/0056 353/15 |
| 2018/0087767 A1* | 3/2018 | Trainer ................ H04R 1/2826 |
| 2019/0189147 A1 | 6/2019 | Monteith et al. |
| 2019/0285950 A1 | 9/2019 | Liu et al. |

FOREIGN PATENT DOCUMENTS

| | | |
|---|---|---|
| JP | 2000098379 A | 4/2000 |
| JP | 2013114965 A | 6/2013 |
| JP | 2014085902 A | 5/2014 |

\* cited by examiner

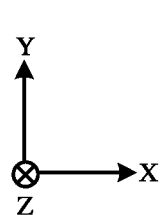
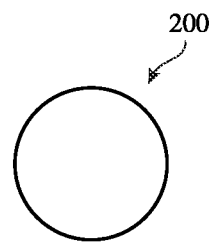
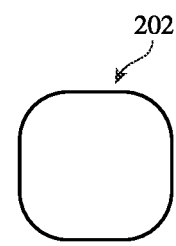
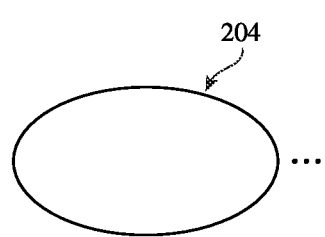
FIG. 2A    FIG. 2B    FIG. 2C
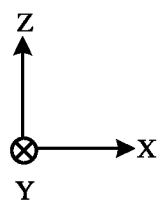
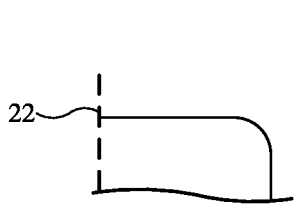
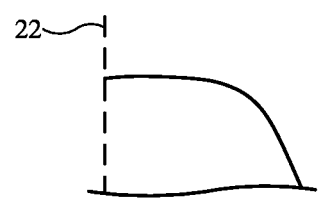
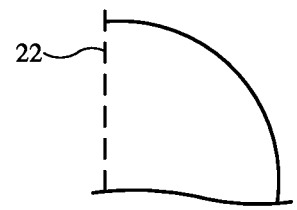
FIG. 2D    FIG. 2E    FIG. 2F
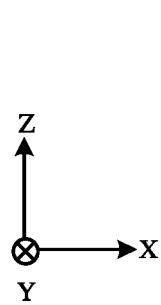
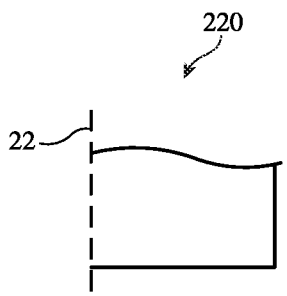
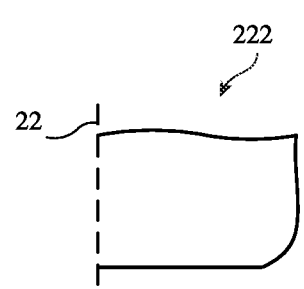
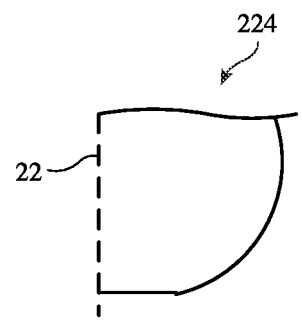
FIG. 2G    FIG. 2H    FIG. 2I

ELECTRONIC DEVICE WITH VISUAL FEEDBACK

This application claims priority to U.S. provisional patent application No. 63/063,115 filed Aug. 7, 2020, which is hereby incorporated by reference herein in its entirety.

FIELD

This relates generally to electronic devices and, more particularly, to electronic devices with light-emitting devices.

BACKGROUND

Electronic devices such as voice-controlled assistant devices may include light-emitting components. During operation, the light-emitting component may emit patterns of light that serve as visual feedback. The feedback helps confirm to a user that an electronic device is operating as desired.

It can be challenging to incorporate light-emitting components into an electronic device. If care is not taken, the patterns of light that are emitted will not appear as intended, the appearance of the device may not be as desired, or the device may be overly bulky.

SUMMARY

An electronic device such as a voice-controlled speaker device may have a housing. A speaker, other input-output components, and control circuitry may be mounted within the housing. During operation, the control circuitry can direct a set of light-emitting components to emit light that passes through the housing. The emitted light may, as an example, serve as visual feedback to confirm that a voice command or other input has been received from a user.

The housing may have an upper housing wall that overlaps the light-emitting components. The upper housing wall, which may sometimes be referred to as a top cap (or top cap portion), may be formed from a curved transparent, translucent, or semi-translucent material. In one suitable arrangement, an array of light-emitting components may be formed on a planar printed circuit and a support structure may surround the array and may include one or more ring-shaped rib members configured as baffles to control the angular spread of light emitted from the light-emitting components. The support structure may be formed from opaque polymer material and may be configured to receive a diffuser layer that rests above the rib members. The device may also include a touch sensor and a clear touch window between the touch sensor and the top cap portion. The touch sensor and the diffuser layer may be separated by an air gap. The top cap and the clear touch window may have lateral edge portions optionally covered by a black coating layer to reduce light leakage that might result in undesired visible artifacts at the edge of the top cap portion.

In another suitable arrangement, an array of light-emitting components may be formed on a planar printed circuit and a light guide and lens structure may be formed over the light-emitting components to direct light towards the top cap portion. The light guide and lens structure may be a solid member molded from transparent polymer material. The light guide and lens structure may include multiple light guides each of which is aligned with a respective one of the light-emitting components. Each light guide may be overlapped by one convex lens or multiple microlenses. The light guide and lens structure may optionally include a prism-type edge portion configured to direct light, via total internal reflection, towards a lateral edge of the top cap portion.

A glyph illumination assembly may be provided within the housing of the electronic device. The glyph illumination assembly may be configured to display a glyph in a glyph display region on the house. The glyph display region may receive a physical touch or other tactile input from a user to control one or more components with the electronic device. In one embodiment, the glyph illumination assembly may include a light-emitting diode, a reticle member, and a lens member configured to project the glyph using the reticle member. In another embodiment, the glyph illumination assembly may include a light-emitting diode, a light guide member, and a lens member for illuminating a photoluminescent glyph layer on the top cap. In yet another embodiment, the glyph illumination assembly may include a light-emitting diode, a light guide member, and a lens member for projecting light towards an opaque glyph masking layer. If desired, a glyph may also be formed as a persistent ink layer on the housing that is visible without requiring any illumination or without requiring any dedicated glyph illumination assembly.

In another suitable arrangement, the light-emitting components may be attached to a flex circuit that is mounted on a curved surface of a support structure. The support structure may be a dome-like or hemispherical molded (or machined) shell layer. One or more driver circuits may be used to drive the light-emitting components on the flex circuit. The flex circuit may be wounded around the support structure in a spiral-like manner to connect to each of the light-emitting components. Alternatively, the flex circuit may have a center portion and multiple arm (branch) portions extending radially from the center portion to connect to each of the light-emitting components.

BRIEF DESCRIPTION OF THE DRAWINGS

FIGS. 2A-2C are top (plan) views of the electronic device of FIG. 1 in accordance with some embodiments.

FIG. 2D-2F are side views of a top portion the electronic device of FIG. 1 in accordance with some embodiments.

FIG. 2G-2I are side views of a bottom portion the electronic device of FIG. 1 in accordance with some embodiments.

DETAILED DESCRIPTION

Electronic devices may have light-emitting devices. A light-emitting device may be used to provide a user with visual feedback during operation of an electronic device. For example, in a voice-controlled device, visual feedback such as moving patterns of lights of different colors may be used to visually confirm to the user that the voice-controlled device is responding to a voice command. Visual output may also include status indicator information and other output.

Figure 1:
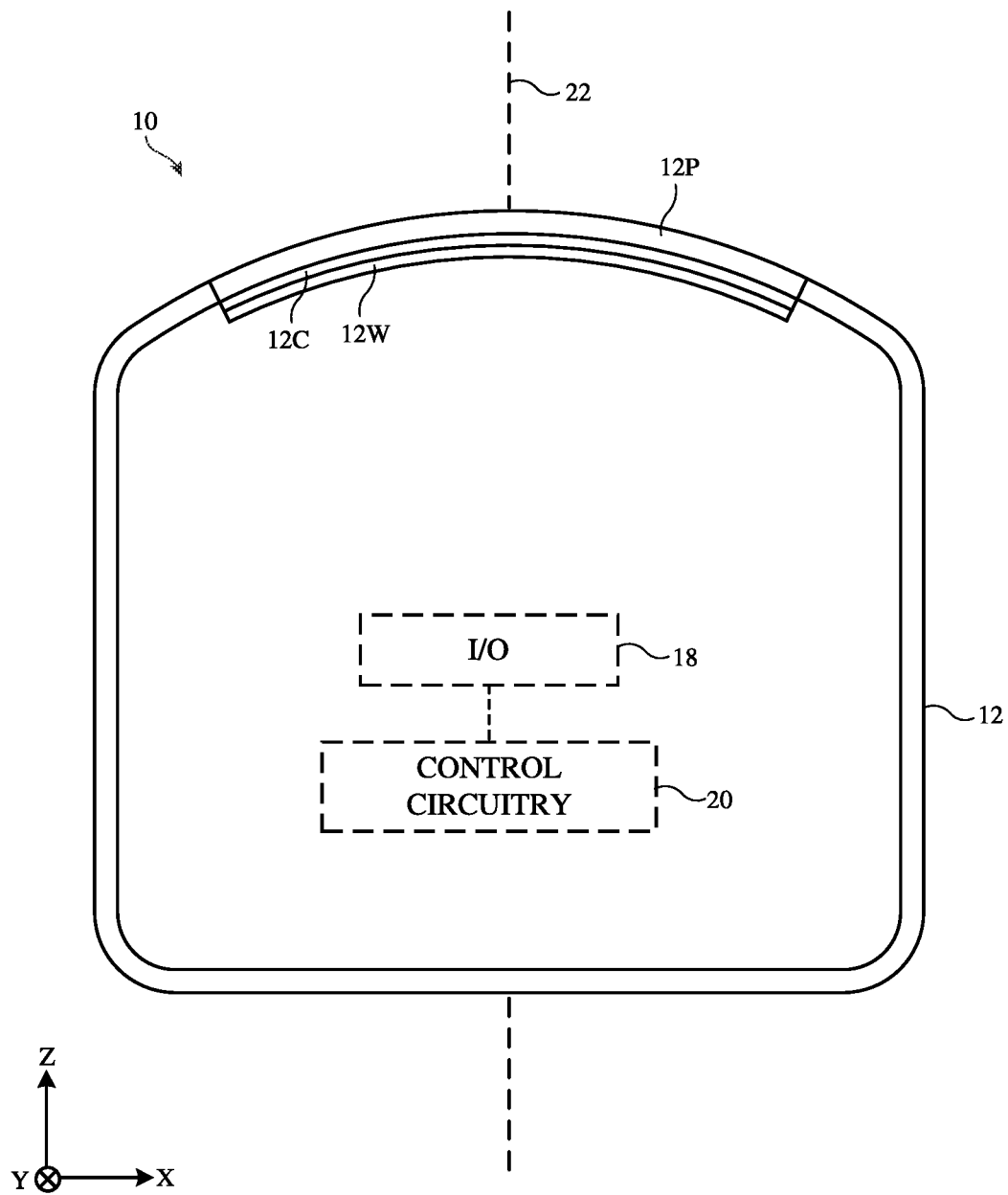
FIG. 1 is a side view of an illustrative voice-controlled electronic device having a light-emitting device in accordance with an embodiment.

FIG. 1 is a side view of an illustrative electronic device 10 that includes a light-emitting device to provide visual output/feedback. When oriented upright, device 10 may have center that is aligned to rotational axis 22 that is parallel to the Z direction. In the example of FIG. 1, device 10 is a voice-controlled device such as a voice-controlled countertop speaker. If desired, device 10 may be an electronic device or an accessory for an electronic device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which equipment for device 10 is mounted in a kiosk, in an automobile, airplane, or other vehicle, other electronic equipment, or equipment that implements the functionality of two or more of these devices.

As shown in FIG. 1, device 10 may include a housing such as housing 12. Housing 12 may have a cylindrical shape with rounded upper and lower ends of the type shown in FIG. 1 or other suitable shape (e.g., a pyramidal shape, a conical shape, a frustoconical shape, a box shape such as a rectangular box shape, a spherical shape, etc.). Housing 12 may include support structures formed from metal, polymer, ceramic, glass, wood, quartz, fiberglass, other materials, and/or combinations of these materials. The shape of housing 12 may be selected to form an enclosure suited to the type of device 10 for which the housing is being used. As an example, in scenarios in which device 10 is a voice-controlled electronic device, housing 12 may be cylindrical, pyramidal, box-shaped, conical, spherical, or other shapes suitable for enclosing one or more speakers; in configurations in which device 10 is a laptop computer, housing 12 may have upper and lower thin box-shaped portions that are joined with a hinge and that can respectively house a display and a keyboard; in configurations in which device 10 is a computer monitor containing an embedded computer, housing 12 may have a slender box shape with optionally curved rear housing walls that can hold a display and be mounted on a stand; in configurations in which device 10 is a tablet computer, cellular telephone, media player, or other handheld or portable electronic device, housing 12 may have a rectangular outline and a thin depth; in configurations in which device 10 is a smaller device such as a wristwatch device or a pendant device, housing 12 may have a thin profile and an outline that is rectangular, square, hexagonal, triangular, oval, or circular; in configurations in which device 10 is a headphone or earpiece device, housing 12 may have a shape configured to fit on or in a user's ear; in configurations in which device 10 is a pair of eyeglasses or other equipment worn on a user's head, housing 12 may have a head-mountable shape; in configurations in which device 10 is a jacket or other item of clothing (e.g., a hat, belt, wrist band, arm band, headband, ring, necklace, shirt, pants, shoes, glove, etc.), housing 12 may be formed from layers of fabric or other material configured to allow device 10 to be worn on a user's body; in configurations in which device 10 is a television, a computer display that does not contain an embedded computer, a gaming device, or a navigation device, housing 12 may have a rectangular outline, an outline with curved sides and/or straight sides, a box shape, a cylindrical shape, and/or other suitable shapes; in configurations in which device 10 is a kiosk, housing 12 can form a pedestal or other shape suitable for a kiosk; in configurations in which device 10 forms part of an automobile, airplane, or other vehicle, housing 12 may form a dashboard, console, door, window, seat, body panel, or other portion of the vehicle; in configurations in which device 10 is a removable external case for electronic equipment, housing 12 may have the shape of a sleeve or other structure with a recess for receiving the electronic equipment; in configurations in which device 10 is a strap, wrist band, necklace or headband, housing 12 may have a strip shape, in configurations in which device 10 forms a case, bag, or wallet, housing 12 may have surfaces that form the walls of the case and/or sides of the bag or wallet and/or that forms straps and/or other structures for the case or bag; and in configurations in which device 10 is part of furniture, housing 12 may be configured to form a part of a chair, sofa, or other seating (e.g., cushions or other seating structures).

In the illustrative configuration of FIG. 1, housing 12 may have any shape suitable for an electronic device such as a voice-controlled speaker with internet access. FIGS. 2A-2C are exemplary top views of electronic device 10. In the example of FIG. 2A, device 10 may have a circular footprint 200 when viewed in the Z direction at the X-Y plane. FIG. 2B shows how device 10 may have a rectangular footprint 202 when viewed in the Z direction, with optional rounded corners or sharp corners. FIG. 2C shows how device 10 may have an oval or elliptical shape 204 when viewed in the Z direction. In general, device 10 may be symmetrical or asymmetrical when viewed from the top and may have any suitable shape or footprint. FIGS. 2D-2F are exemplary side views of a top portion of electronic device 10 when viewed in the Y direction at the X-Z plane. In the example of FIG. 2D, device 10 may have a flat top and a straight vertical edge with an optional rounded corner connecting the flat top portion to the straight vertical edge. FIG. 2E shows another example in which device 10 has a slightly curved top and a curved vertical edge extending downwards from the curved top. FIG. 2F shows how device 10 may have a continuous curvature extending from rotational axis 22 to the side edge of the device (e.g., to form a spherical or dome-like top housing portion). FIGS. 2G-2I are exemplary side views of a lower portion of electronic device 10 when viewed in the Y direction. In the example of FIG. 2G, device 10 may have a flat bottom and a straight vertical edge with a sharp corner connecting the flat base portion to the straight vertical edge. FIG. 2H shows another example in which device 10 has a flat base portion and a straight vertical edge with a rounded corner connecting the flat bottom portion to the straight vertical edge. FIG. 2I shows how device 10 may have a flat base portion and a continuous curvature extending from the flat base portion to the side edge of the device (e.g., to form an overall spherical, bulb-shaped, or tulip-shaped housing portion). Housing 12 may have other shapes and may be incorporated into other devices, if desired.

If desired, device 10 may include fabric. The fabric may form all or part of a housing wall or other layer in an electronic device, may form the outermost layer of device 10, may form one or more inner covering layers, may form internal structures in an electronic device, or may form other fabric-based structures. Device 10 may be soft (e.g., device 10 may have a fabric surface that yields to a light touch), may have a rigid feel (e.g., the surface of device 10 may be formed from a stiff fabric), may have a surface that is textured, that is smooth, that has ribs or other patterned textures, and/or may include portions formed from non-fabric structures of plastic, metal, glass, crystalline materials, ceramics, or other materials. The fabric may include intertwined strands of material. The fabric may, for example, include warp knit fabric that is formed by warp knitting of the strands and/or may include woven fabric, fabric with braided strands of material, etc. The strands may be single-filament strands (sometimes referred to as fibers or monofilaments) or may be strands of material formed by intertwining multiple monofilaments of material together (sometimes referred to as yarns). The strands may be formed from polymer, metal, glass, graphite, ceramic, natural materials such as cotton or bamboo, or other organic and/or inorganic materials and combinations of these materials. Conductive coatings such as metal coatings may be formed on non-conductive material. For example, plastic strands in the fabric may be coated with metal to make them conductive. Reflective coatings such as metal coatings may be applied to make strands reflective. Strands formed from white polymer (e.g., light-scattering particles in polymer) and/or that are coated with white polymer may help reflect light in some configurations. Darkly colored strands may also be used. If desired, strands may be formed from bare metal wires or metal wire intertwined with insulating monofilaments (as examples). Bare metal strands and strands of polymer covered with conductive coatings may be provided with insulating polymer jackets. In some configuration, the strands may include optical fibers.

In an illustrative configuration, some or all of the upper surface of housing 12 such as portion 12P may be formed from rigid polymer, rigid glass, or other non-fabric structure and the sidewall surfaces of housing 12 may be covered with the fabric material (e.g., to create a cover layer for the sidewalls that is transparent to sound). Portion 12P may sometimes be referred to as an upper housing wall or top cap. For example, portion 12P may be formed from a disk-shaped polymer or glass member with a slightly curved cross-sectional profile and a circular outline (e.g., portion 12P may form a protruding dome shape or other suitable housing shapes). Portion 12P may be formed from transparent materials. The transparent materials may be translucent (hazy) or may exhibit low haze. The use of translucent material and/or other transparent material for portion 12P allows underlying light-emitting components in the interior of device 10 to emit light that passes through portion 12P. For example, portion 12P may be formed from clear material, material with a neutral tint (e.g., dark polymer or semi-opaque glass that allows light to pass), or material with a non-neutral color (e.g., blue, red, etc.). As shown in FIG. 1, a semi-opaque white layer such as layer 12W may be painted or otherwise formed at the bottom surface of top cap portion 12P. In the example where portion 12P is formed from clear material, layer 12W may be formed directly on the bottom surface of top cap 12P. In the example where portion 12P is formed from a darker tint material, a color adjustment layer 12C may optionally be interposed between top cap portion 12P and layer 12W to fine tune the tint of portion 12P as viewed by the user.

Portion 12P may optionally overlap a touch sensor formed within the device housing. For example, a two-dimensional capacitive touch sensor may be formed from an array of capacitive touch sensor electrodes that are overlapped by portion 12P. Capacitive touch sensor circuitry may be coupled to the touch sensor electrodes and may gather user touch input through portion 12P. The capacitive touch sensors may be formed directly under the inner surface of portion 12P (e.g., directly on top cap 12 or on white layer 12W), which therefore serves as a substrate for the touch sensors, or may be formed on separate supporting structures (e.g., a separate polymer film or other separate substrate). Capacitive touch sensor electrodes may be formed from conductive material such as metal, transparent conductive material such as indium tin oxide, or other conductive materials. If desired, one-dimensional, two-dimensional, and/or three-dimensional sensors such as proximity sensors, optical touch sensors, force sensors, image sensors, time-of-flight sensors, vibration sensors such as accelerometers, and/or other sensors may be formed under portion 12P or other portions of housing 12 (e.g., instead of a two-dimensional capacitive touch sensor or in addition to a two-dimensional capacitive touch sensor). If desired, sensors may operate through fabric sidewalls or other housing structures.

Device 10 may include control circuitry 20. Control circuitry 20 may include microprocessors, microcontrollers, application-specific integrated-circuits, digital signal processors, baseband processors, and/or other controllers and may include storage such as random-access memory, read-only memory, solid state drives, and/or other storage and processing circuitry.

Control circuitry 20 may gather information from sensors and other circuitry in input-output devices 18 and may use input-output devices 18 to supply output. Input-output devices 18 may, for example, include audio devices such as microphones and speakers. Microphones can gather audio input (e.g., sound that passes through fabric 14 such as voice commands for controlling the operation of device 10). Speakers can produce audio output (e.g., sound that passes through fabric 14). Sensors in input-output devices 18 may include touch sensors, force sensors, capacitive sensors, optical sensors, proximity sensors, strain gauges, temperature sensors, moisture sensors, gas sensors, pressure sensors, magnetic sensors, position and orientation sensors (e.g., accelerometers, gyroscopes, and/or compasses), and/or other sensors. Sensors such as these may, if desired, be overlapped by housing portion 12P (e.g., a polymer layer or glass layer).

Light-emitting diodes, displays, and other visual output devices may be used in supplying visual output to a user. As an example, visual output devices may be used to form illuminated buttons, displays that display images, visual feedback areas that display still and/or moving patterns of light to indicate to a user that a command has been received and/or is being processed by control circuitry 20, etc. Commands may be received using a touch sensor (if present), voice commands may be received by control circuitry 20 using a microphone in input-output devices 18, and other input may be received using input-output devices 18. If desired, buttons, joysticks, haptic output components, and/or other input-output components may be provided in input-output devices 18 to gather input from a user and to provide a user with output. Wireless communications circuitry in circuitry 20 (e.g., wireless local area network circuitry, cellular telephone circuitry, etc.) may be used to support wireless communications with external equipment (e.g., to form a communications link with internet-based equipment or other electronic equipment).

Light-emitting components (e.g., lasers or light-emitting diodes) may be arranged in a pattern under portion 12P of housing 12 or other suitable portion of housing 12. In general, any suitable light-based output may be supplied by light-based output devices in device 10. For example, displays with arrays of pixels may display images, text output devices such as segmented light-emitting diode displays may display text, and status indicator lights may provide light output indicative of device operating status (e.g., a power on/off status, battery level status, volume level status, mute/non-muted status, etc.). In an illustrative arrangement, which may sometimes be described as an example, a light-emitting device in device 10 is formed from a set of light-emitting components that are located under housing portion 12P. The light-emitting device may be used to provide status information, decorative patterns, visual feedback (e.g., confirmation of receipt by control circuitry 20 of device 10 of voice commands), and/or other visual information that is visible through portion 12P.

In accordance with one suitable arrangement, device 10 may have a light-emitting device 30 that includes a plurality of light-emitting components 34 mounted on a curved support structure such as structure 32. Support structure 32 may have a hemispherical or dome-like shape. Support structure 32 may be formed from polymer, metal, or other suitable material suitable to provide mechanical support for the light-emitting components 34. Support structure 32 may, for example, be a hollow shell that can accommodate other electrical components enclosed by the dome-like shell. Although the surface of structure 32 is shown as having a smooth curvature, support structure 32 may be multifaceted and may include locally depressed regions for receiving each respective light-emitting component 34. Center light-emitting component 34C that is aligned with rotational axis 22 may be mounted at the apex of the hemispherical support structure 32. The distance between each pair of adjacent light-emitting components 34 should be the same. Each light-emitting component 34 should also be separated from housing portion 12P by a fixed distance L. Arranged in this way, housing portion 12P may be uniformly illuminated by the array of components 34.

Air gap 24 may separate light-emitting components 34 from housing portion 12P. Although not shown in FIG. 2, layers such as layers 12W and 12C of FIG. 1 may be formed at the inner surface of top cap 12P. The presence of air gap 24 may help promote light mixing. If desired, one or more light-diffusing structures formed from solid transparent structures with curved surfaces (e.g., lens structure), textured films, light-scattering structures embedded in clear polymer or other material, and/or other light scattering and diffusing structures that help homogenize emitted light and reduce hotspots may be interposed between light-emitting components 24 and top cap portion 12P.

Figure 4A:
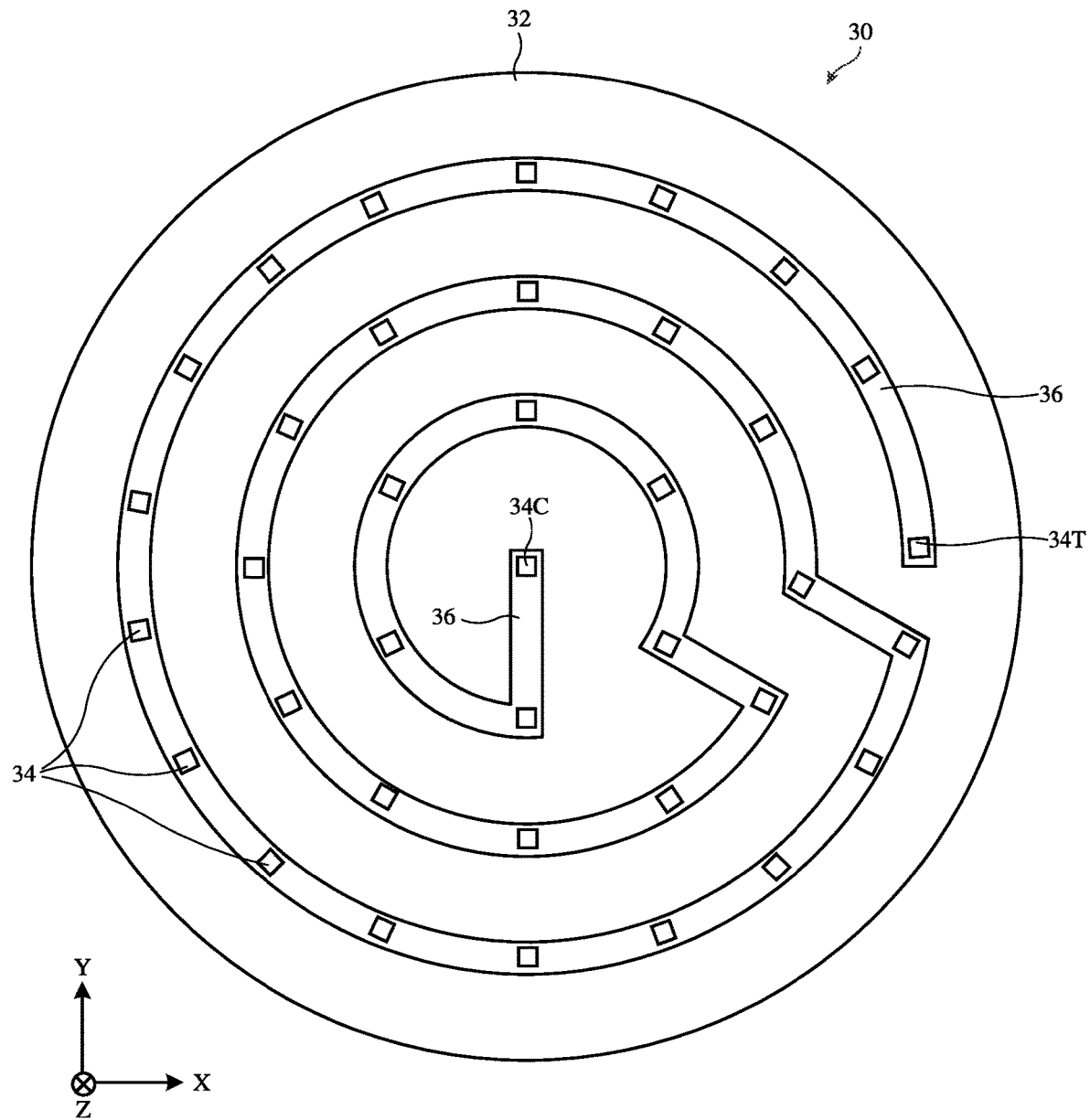
FIG. 4A is a top (plan) view of an illustrative array of light-emitting components arranged along a spiral flex circuit in accordance with an embodiment.

FIG. 4A is a top view of light-emitting device 30 illustrating a pattern of light-emitting components 34 interconnected via a single flex circuit such as flex circuit 36. Flex circuit 36 may contain signal lines that convey signals from control circuitry 20 (FIG. 1) to components 34 so that components 34 may emit desired amounts of light. The color of emitted light may be controlled by adjusting the emitted color from each of components 34. With an illustrative configuration, each component 34 contains components such as red light-emitting component 34R (e.g. a red light-emitting diode or red laser), green light-emitting component 34G (e.g., a green light-emitting diode or green laser), and blue light-emitting component 34B (e.g., a blue light-emitting diode or blue laser). With this type of configuration, the color of light that is emitted can be adjusted by adjusting the relative light intensity from each of the colored subcomponents of each component 34. The pattern of light that is emitted (e.g., the location in the X-Y plane of the emitted light) can be controlled by controlling components 34 (e.g., to turn on a first component 34 on the left side of device 10 while turning off a component 34 on the right side of device 10, to display blue light from one component and red from another, to display a pattern with a gradient of light intensity, etc.). If desired, flashing light effects, chasing light effects, lighting effects involving emission of light patterns that swirl or otherwise move about the X-Y plane of FIG. 4A may be produced.

As shown in FIG. 4A, flex circuit 36 may be a single long strip of flex circuit connecting the center light-emitting component 34C to each successive ring of light-emitting components in a spiral-like routing pattern (e.g., flex circuit 36 first couples the center component 34C to the inner-most ring of light-emitting components, and then couples the inner-most ring of light-emitting components to the next outer ring of light-emitting components, and so on until the last trailing light-emitting component 34T is reached). In other words, flex circuit 36 connects to each of the light-emitting components 34 in a serial-like manner. Each light-emitting component 34 may be attached to flex circuit 36 via an adhesive layer (e.g., a pressure sensitive adhesive layer), solder bonding, dedicated connectors, or other suitable mounting mechanism. The use of flex circuit 36 is merely illustrative. In general, other types of flexible or rigid circuit boards or substrate may be used to interconnect each of the light-emitting components 34 within light-emitting device 30.

The array of light-emitting components 34 may be driven by one or more driver circuits. In one arrangement, an LED driver circuit located by the center light-emitting component 34C may be used to drive all of the light-emitting components in a serial manner. In another arrangement, an LED driver circuit located by the tail light-emitting component 34T may be used to drive all of the light-emitting components in a serial manner. In yet another arrangement, a dedicated LED driver may be formed next to each light-emitting component to individually drive each component 34 separately in parallel. In yet other suitable arrangements, the array of light-emitting components 34 may be organized into different groups, each of which can be separately driven by its own dedicated driver circuit.

Figure 4B:
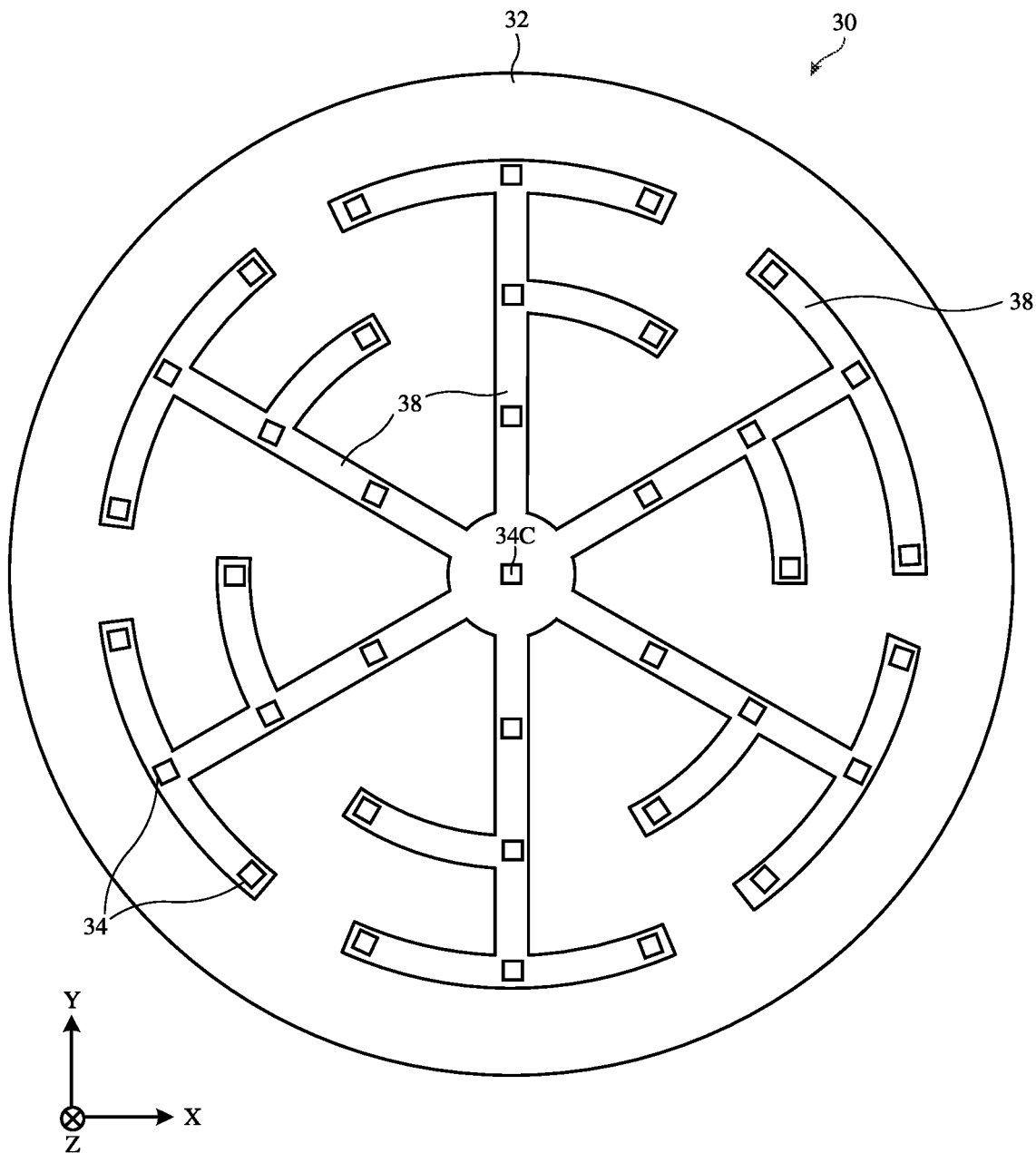
FIG. 4B is a top (plan) view of an illustrative array of light-emitting components arranged along a flex circuit with radially-extending branches in accordance with an embodiment.

FIG. 4B is a top view of another suitable configuration of light-emitting device 30 illustrating a pattern of light-emitting components 34 interconnected via a single flex circuit such as flex circuit 38. As shown in FIG. 4B, flex circuit 38 may have a center portion on which component 34C is mounted and may have multiple branches (arms) extending radially from the center portion to connect to the remaining surrounding light-emitting components 34. For example, the top arm extending north may connect to six corresponding light-emitting components 34; the next arm extending northeast may connect to six corresponding light-emitting components 34; the next arm extending southeast may also connect to another six corresponding light-emitting components 34; and so on. The example of FIG. 4B in which all of the light-emitting components are connected using six branches is merely illustrative. In general, any pattern of light-emitting components formed on support structure 32 may be interconnected using flex circuit 38 with seven radially extending branches, more than seven radially extending branches, less than six radially extending branches, 2-10 radially extending branches, etc. Each light-emitting component 34 may be attached to flex circuit 38 via an adhesive layer (e.g., a pressure sensitive adhesive layer), solder bonding, dedicated connectors, or other suitable mounting mechanism. The use of flex circuit 38 is merely illustrative. In general, other types of flexible or rigid circuit boards or substrate may be used to interconnect each of the light-emitting components 34 within light-emitting device 30.

The array of light-emitting components 34 may be driven by one or more driver circuits. In one arrangement, an LED driver circuit located by the center light-emitting component 34C may be used to drive all of the light-emitting components across the multiple branches. In another arrangement, each branch may be provided with its own dedicated LED driver, which might be located at the tip or at the terminal portion of each arm. In yet another arrangement, a dedicated LED driver may be formed next to each light-emitting component to individually drive each component 34 separately in parallel. In yet other suitable arrangements, the array of light-emitting components 34 may be organized into different groups, each of which can be separately driven by its own dedicated driver circuit.

Figure 3:
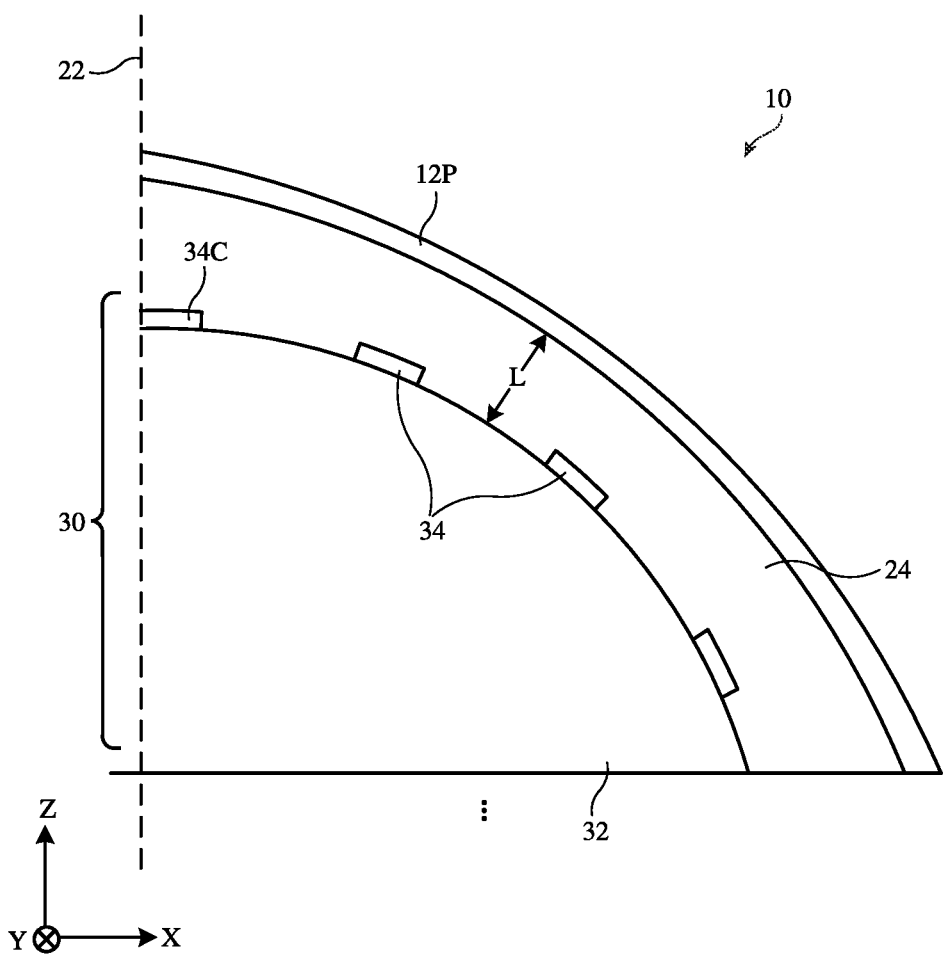
FIG. 3 is a cross-sectional side view of a portion of the device of FIG. 1 showing how light-emitting components may be mounted on a curved surface in accordance with an embodiment.
Figure 5:
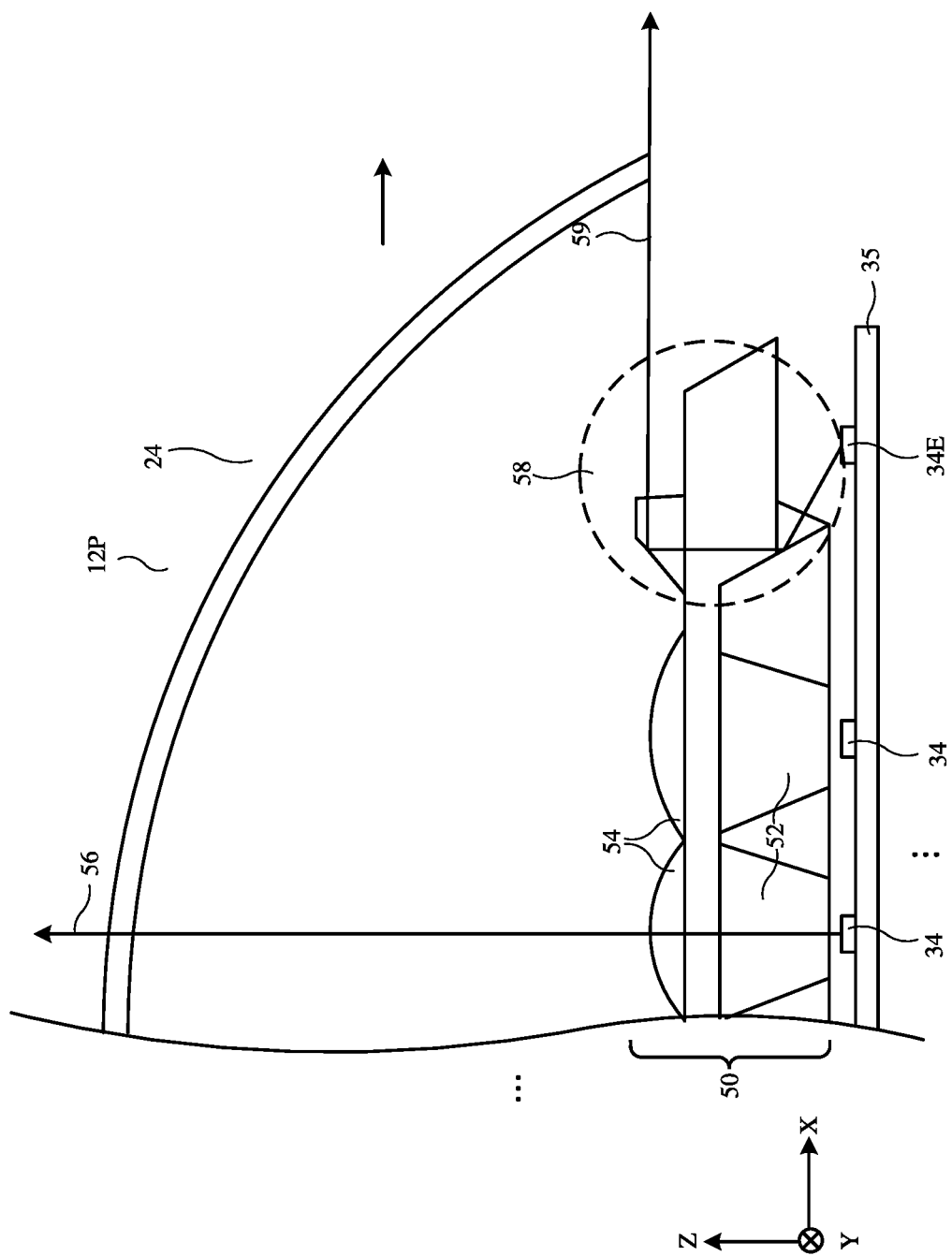
FIG. 5 is a cross-sectional side view of a portion of the device of FIG. 1 showing illustrative light guide and lens structures formed over a planar array of light-emitting components in accordance with an embodiment.

The examples of FIGS. 3, 4A, and 4B in which the light-emitting components are mounted on a curved surface are merely illustrative and are not intended to limit the scope of the present embodiments. FIG. 5 illustrates another suitable arrangement in which the light-emitting components are mounted on a planar printed circuit 35 (e.g., a printed circuit board or PCB). Printed circuit 35 may be coplanar with the X-Y plane. Printed circuit 35 may contain signal lines that convey signals from control circuitry 20 to components 34 so that components 34 may emit desired amounts of light. The color of emitted light may be controlled by adjusting the emitted color from each of components 34. With an illustrative configuration, each component 34 contains components such as red light-emitting component 34R (e.g. a red light-emitting diode or red laser), green light-emitting component 34G (e.g., a green light-emitting diode or green laser), and blue light-emitting component 34B (e.g., a blue light-emitting diode or blue laser). With this type of configuration, the color of light that is emitted can be adjusted by adjusting the relative light intensity from each of the colored subcomponents of each component 34. The pattern of light that is emitted (e.g., the location in the X-Y plane of the emitted light) can be controlled by controlling components 34 (e.g., to turn on a first component 34 on the left side of device 10 while turning off a component 34 on the right side of device 10, to display blue light from one component and red from another, to display a pattern with a gradient of light intensity, etc.). If desired, flashing light effects, chasing light effects, lighting effects involving emission of light patterns that swirl or otherwise move about the X-Y plane of FIG. 5 may be produced.

Although the light-emitting components 34 are all mounted on a planar surface, light-emitting components 34 may still output light that is spread uniformly across the curved top cap portion 12P. Top housing portion 12P may have a hemispherical shape, a dome-like shape, or other curved profile. To help achieve improved contrast in emission light patterns as well as uniformity across the entire surface of the dome-like portion 12P, light guide and lens structure 50 may be formed over the light-emitting components. Light guide and lens structure 50 may include bottom light guide portions 52 configured to homogenize light emitted from the underlying light-emitting components 34 while directing light upwards toward portion 12P and may also include top lens portions 54 (e.g., convex lens structures) configured to further help collimate light in the Z direction as shown by arrow 56. Each light guide portion 52 and lens portion 54 may be formed over a respective light-emitting component 34.

Structure 50 may further include an edge flange portion 58 configured as an internal reflector prism-type structure. The edge flange portion 58 may be positioned over an outermost group of light-emitting components 34E formed along the edge of printed circuit 35. The edge portion 58 may have multiple beveled surfaces (e.g., at least one beveled edge, at least two beveled edges, at least three beveled edges, more than three beveled edges, etc.). As shown by arrow 59, flange portion 58 may have a prism-like structure configured to direct light, via the principal of total internal reflection (TIR), towards the lateral edge of the top cap display housing portion (e.g., towards the equator region of the hemispherical top cap dome). Arrow 59 output from portion 58 may be substantially parallel to the X-Y plane (or may be projected at a slight elevation with a relatively small angle of less than 5° from the X-Y plane, less than 10° from the X-Y plane, less than 15° from the X-Y plane, or less than 20° from the X-Y plane, etc.). The edge flange portion 58 of structure 50 may therefore sometimes be referred to as a total internal reflection (TIR) top cap edge illumination feature. Structure 30 may be formed from a solid molded (and/or machined) layer of clear material (e.g., polymer) and/or may include separate components (e.g., individual lenses and light guide members supported in a desired pattern using a frame). Configurations in which structure 50 is a unitary member with molded lens structures, molded light guide structures, and molded TIR edge structures may sometimes be described herein as an example.

Air gap 24 may separate structure 50 from housing portion 12P. Although not shown in FIG. 5, layers such as layers 12W and/or 12C of FIG. 1 may be formed at the inner surface of portion 12P. The presence of air gap 24 may help promote light mixing. If desired, one or more light-diffusing structures formed from solid transparent structures with curved surfaces (e.g., lens structure), textured films, light-scattering structures embedded in clear polymer or other material, and/or other light scattering and diffusing structures that help homogenize emitted light and reduce hotspots may be interposed between structure 50 and top cap portion 12P.

Figure 6:
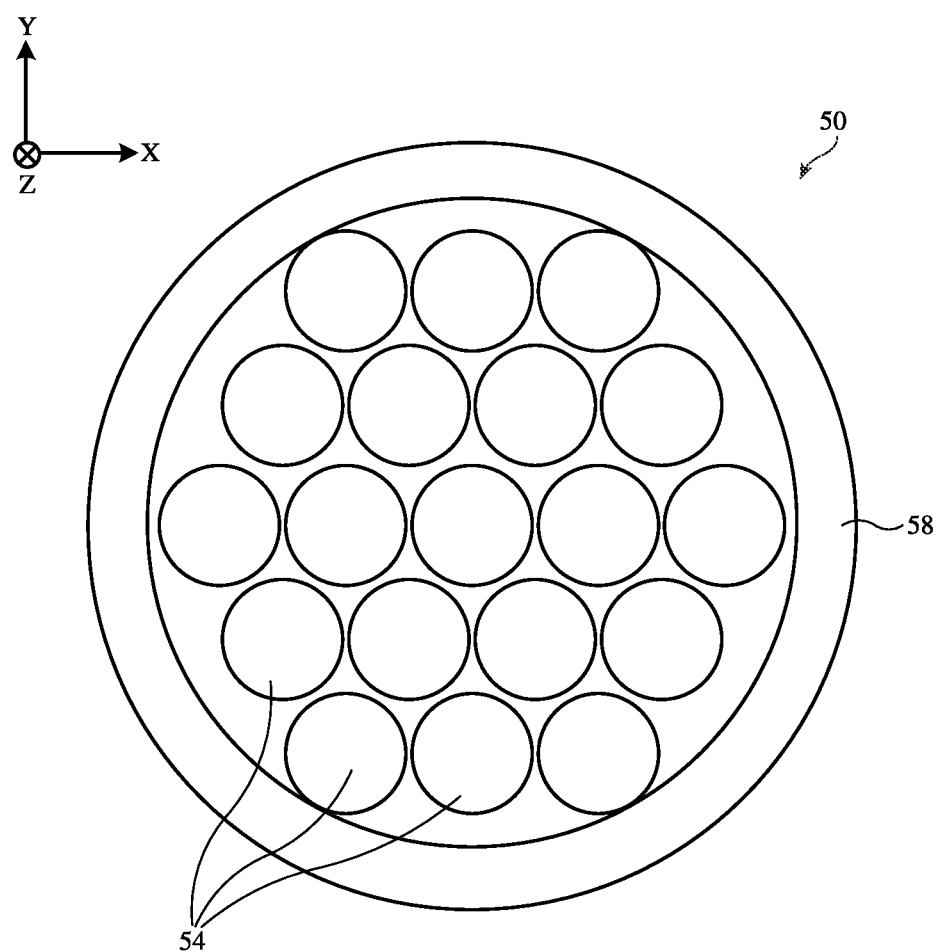
FIG. 6 is a top (plan) view of the illustrative light guide and lens structures of FIG. 5 having an internal reflector prism-type ring portion in accordance with an embodiment.

FIG. 6 is a top (plan) view of light guide and lens structure 50 when viewed in the Z direction. The example of FIG. 6 in which structure 50 has an overall circular outline is merely illustrative. If desired, structure may have an oval/elliptical footprint, a rectangular footprint, a triangular footprint, a diamond-shaped footprint, a pentagonal footprint, a hexagonal footprint, or other desired symmetrical or asymmetrical outlines. Structure 50 of FIG. 6 includes 19 lenses 54, but this is merely illustrative. If desired, structure 50 may be provided with 10-20 lenses, less than 10 lenses, 20-30 lenses, more than 30 lenses, or any suitable number of lenses depending on the number of light-emitting components within device 10. Flange portion 58 may be configured as a ring-shaped border region that surrounds the plurality of lenses 54.

Figure 7:
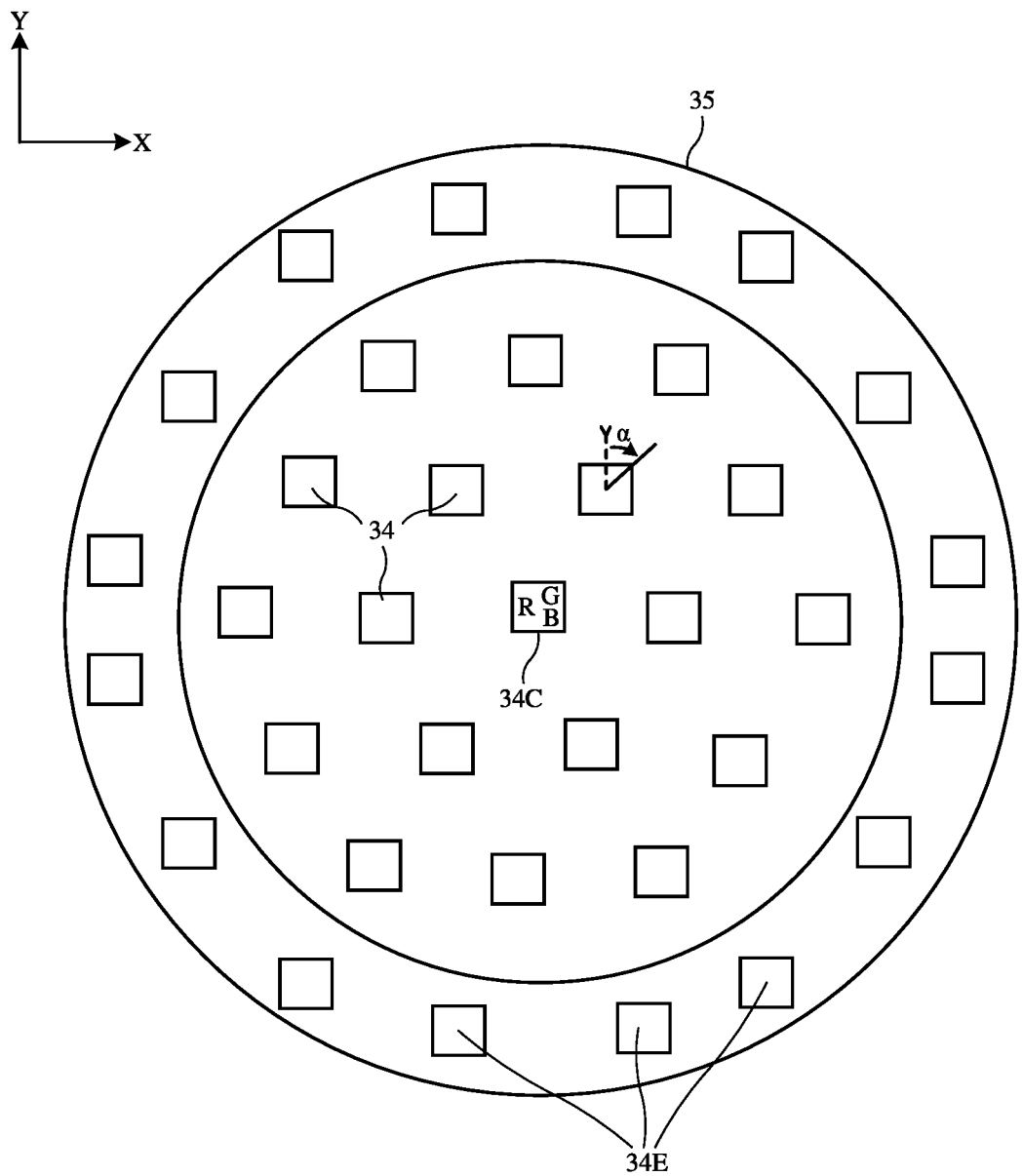
FIG. 7 is a top (plan) view of the planar array of light-emitting components of FIG. 5 in accordance with an embodiment.

FIG. 7 is a top (plan) view of the array of light-emitting components 34 mounted on printed circuit board 35. Similar to FIG. 6, printed circuit board 35 may have an overall circular outline but may alternatively have an oval/elliptical footprint, a rectangular footprint, a triangular footprint, a diamond-shaped footprint, a pentagonal footprint, a hexagonal footprint, or other desired symmetrical or asymmetrical outlines. Any suitable pattern of light-emitting components 34 may be distributed across the surface of PCB 35. The distance between each adjacent pair of light-emitting components 34 may be equal or different. To match the lens configuration of FIG. 6, FIG. 7 may similarly include 19 light-emitting components in the inner portion, but this is merely illustrative. If desired, the inner portion of printed circuit 35 may be provided with 10-20 light-emitting components (or lasers), less than 10 light-emitting components (or lasers), 20-30 light-emitting components (or lasers), more than 30 light-emitting components (or lasers), or any suitable number of light-emitting components (or lasers). A ring of light-emitting components 34E may be formed at the edge of printed circuit 35 surrounding the inner portion and may be used to emit light towards the ring-shaped TIR flange portion 58 for illuminating the lateral peripheral edge of housing portion 12P.

In some arrangements, all of the light-emitting components 34 on the printed circuit 35 may be oriented in the same way. As described above, each light-emitting component 34 may include a red (R) subcomponent, a green (G) subcomponent, and a blue (B) subcomponent. If care is not taken, the light-emitting components may generate a visual output that is not color balanced. For instance, if all the light-emitting components 34 are oriented in the same way as the center light-emitting component 34C (where the red subcomponent is always facing west), then the visual output may have a more reddish bias towards the west.

To improve color balance, at least some of the light-emitting components 34 in the array may be rotated by an angle α with respect to the Y axis. In one suitable arrangement, every other light-emitting component may be rotated by an angle α that is equal to 90°, 180°, 270°, 45°, 60°, 120°, 225°, 315°, or other suitable angle. For instance in the arrangement of FIG. 7, the center diode 34C may have a given nominal orientation while every other diode in the inner ring surrounding the center diode 34C may be rotated by an angle α=180° relative to the given nominal orientation and while every other diode in the next intermediate ring surrounding the inner ring may also be rotated by an α=180° relative to the given nominal orientation. Similarly, every other diode 34E along the edge region may also optionally be rotated by an α=180° relative to the given nominal orientation. In another suitable arrangement, one out of three neighboring light-emitting components may be rotated by an angle α that is equal to 90°, 180°, 270°, 45°, 60°, 120°, 225°, 315°, or other suitable angle. In yet another suitable arrangement, a first group of light emitting components may be rotated by a first angle, a second group of light emitting components may be rotated by a second angle that is different than the first angle, etc. By rotating at least some subset of the light-emitting components while keeping others oriented in the same way as the center diode 34C, improved color balance may be achieved.

Figure 8:
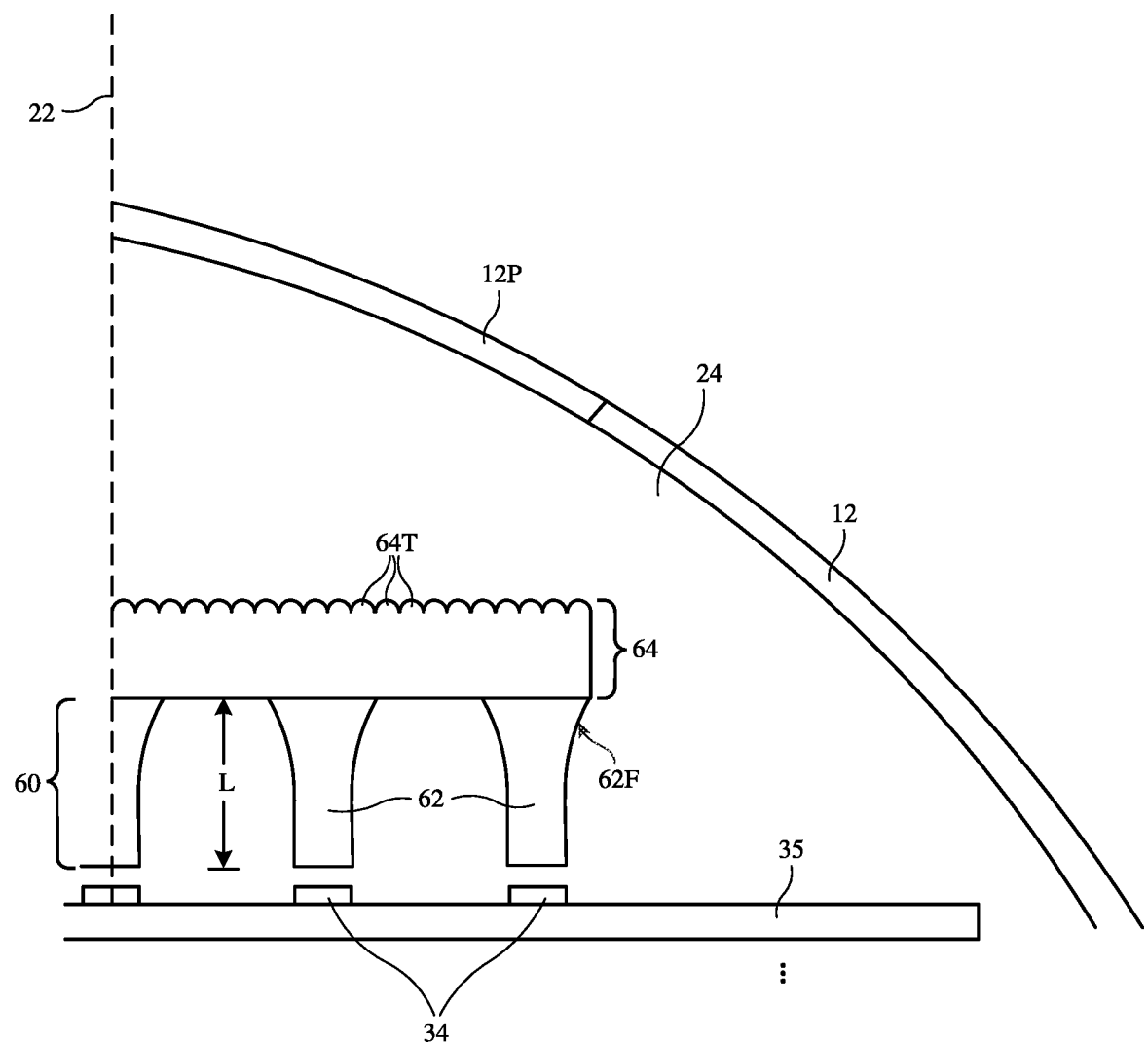
FIG. 8 is a cross-sectional side view of a portion of the device of FIG. 1 showing illustrative light guide and color-mixing microlens structures formed over a planar array of light-emitting components in accordance with an embodiment.

The example of FIGS. 5-7 in which the top cap portion 12P extends from above the array of light-emitting components all the way down to the same elevation as the light-emitting components is merely illustrative and is not intended to limit the scope of the present embodiments. FIG. 8 illustrates another suitable arrangement in which the transparent (or semi-transparent or translucent) top cap portion 12P extends only wide enough to cover the array of light-emitting components while the opaque or fabric housing portion 12 covers the remainder of the upper curved surface. Top cap portion 12P might only be as wide as structure 60 (e.g., portion 64 might be as wide as or slightly wider than the footprint of top cap 12P or may be slightly narrower than the footprint of top cap 12P). Configured in this way, there is no need to illuminate the lateral edge (i.e., the equator region) of the domed upper surface since the displaying top cap portion 12P does not extend that far.

An array of light-emitting components 34 may be mounted on a planar printed circuit 35, which is coplanar with the X-Y plane. Printed circuit 35 may contain signal lines that convey signals from control circuitry 20 to components 34 so that components 34 may emit desired amounts of light. The color of emitted light may be controlled by adjusting the emitted color from each of components 34. Although the light-emitting components 34 are all mounted on a planar surface, light-emitting components 34 may still output light that is spread uniformly across the curved top cap portion 12P. Top housing portion 12P may have a dome-like shape, may represent an upper portion of a hemispherical profile, or may have other arched, bulged, or curved profile.

To help achieve improved contrast in emission light patterns as well as uniformity across the entire surface of the dome-like portion 12P, a light guide and lens structure 60 may be formed over the light-emitting components. Light guide and lens structure 60 may include bottom light guide portions 62 configured to provide color mixing for light emitted from the underlying components 34 while directing light upwards toward portion 12P and may also include top microlens portion 64 configured to homogenize light projected upward towards portion 12P. Structure 60 may therefore sometimes be also referred to as a light guide and microlens structure. Each light guide portion 62 may be formed over a respective light-emitting component 34. Each light guide portion 62 may be implemented as a flared tube member (e.g., a tube with a straight cylindrical bottom terminal portion with an octagonal, a square, or other polygonal or oval cross-section, and a wider flared curved upper terminal portion 62F). The length L of each light guiding tube and the angle of the flared portion 62F may be optimized to promote the desired amount of light mixing, collimation, and stray light control to direct light upwards toward the overarching top cap housing portion 12P.

Microlens portion 64 may have an upper surface provided with a fine array of microlenses 64T to provide additional fine-grain light mixing. Although curved microlens structures are shown in the example of FIG. 8, the upper member 64 may be provided with other textured structures such as pyramidal structures, spherical structures, conical structures, frustoconical structures, ridges, bumps and/or other protrusions, grooves, pits, recesses, and/or other depressions, etc. Upper member 64 may include one or more textured films, light-scattering structures or particles embedded in clear polymer or other material, and/or other light scattering and diffusion structures that help homogenize light and reduce hotspots. The light-scattering structures may include voids (e.g., vacuum-filled cavities, gas-filled cavities such as air bubbles, cavities filled with nitrogen or other inert gases, etc.) and/or may include light-scattering particles having refractive index values that differ from the rest of member 64. The light-scattering particles may include, for example, titanium dioxide particles or other particles of inorganic dielectric. Structure 60 may be formed from a solid molded (and/or machined) layer of clear material (e.g., polymer) and/or may include separate components (e.g., a microlens array member separately attached to light guide members supported in a desired pattern using a frame). Configurations in which structure 60 is a unitary member with molded light guide structures and with an integrated microlens array may sometimes be described herein as an example.

Air gap 24 may separate structure 60 from housing portion 12P. The presence of air gap 24 may help promote light mixing. If desired, one or more light-diffusing structures formed from solid transparent structures with curved surfaces (e.g., lens structure), textured films, light-scattering structures embedded in clear polymer or other material, and/or other light scattering and diffusing structures that help homogenize emitted light and reduce hotspots may be interposed between structure 60 and top cap portion 12P.

As described above, the light-emitting device within electronic device 10 may be used to provide status information, decorative patterns, visual feedback (e.g., confirmation of receipt by control circuitry 20 of device 10 of voice commands), and/or other visual information that is visible through portion 12P. Thus, in addition to the lighting effects involving emission of light patterns that swirl produced during confirmation of receipt by control circuitry 20 of voice commands, device 10 may also output status indicators (e.g., to indicate the current volume level of device 10 or other operating state information).

Figure 9:
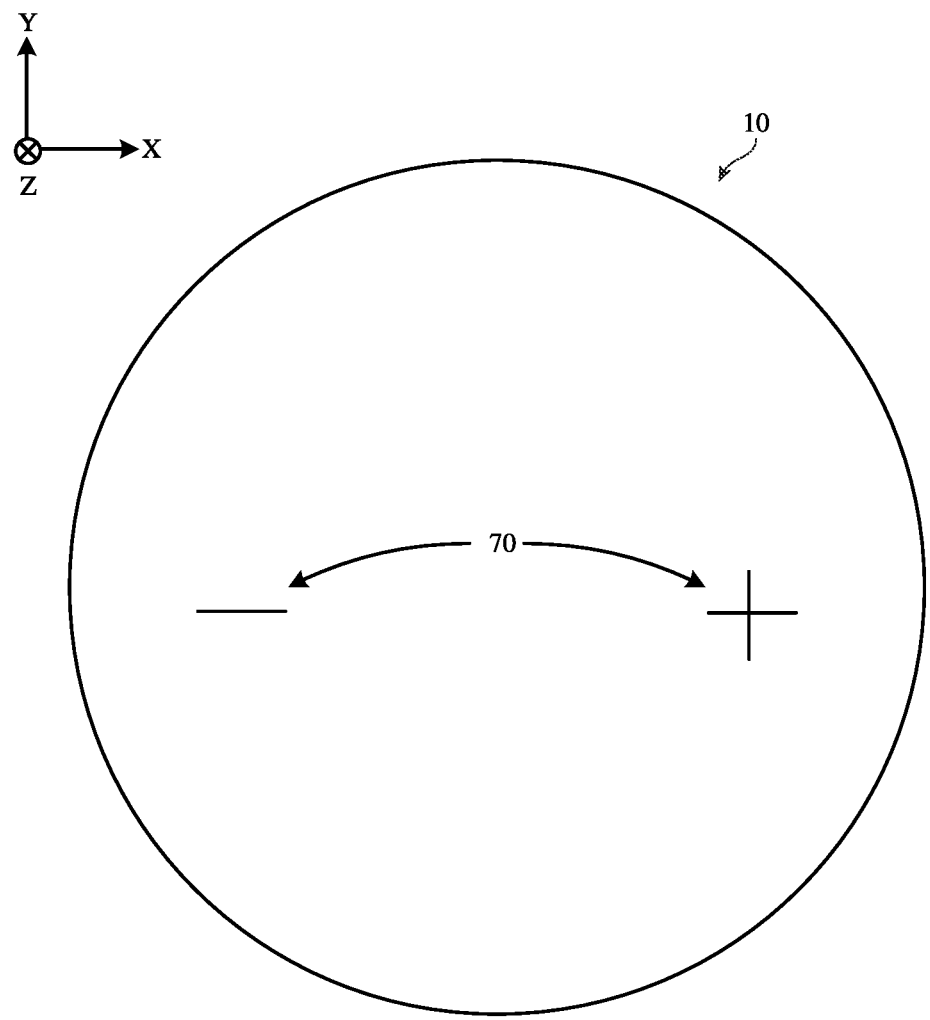
FIG. 9 is top view of the electronic device of FIG. 1 showing illustrative indicator glyphs in accordance with an embodiment.

FIG. 9 shows a top view of device 10 when viewed in the Z direction. Control circuitry 20 can create alphanumeric letters or other symbols/icons (sometimes referred to as glyphs) that is visible on the top surface of device 10. As shown in FIG. 9, glyphs such as "+" and "−" volume indicator glyphs 70 may be selectively output to the user. In one suitable arrangement, glyphs 70 might be formed in the same region as the swirling pattern that is output to the user during confirmation of receipt of a voice command (e.g., glyphs 70 may be displayed in the top cap region 12P). In another suitable arrangement, glyphs 70 might be generated in a region that is separate from the top cap region where the swirling pattern is displayed (e.g., glyphs 70 might be displayed in a region that is outside the border of the top cap portion 12P). When the user presses or provides other physical control input on the region where the + glyph is located, the + glyph may light up while control circuitry 20 directs the speaker(s) within device 10 to increase its volume. When the user presses on the region where the − glyph is located, the − glyph may be illuminated while control circuitry 20 directs the speaker(s) within device 10 to decrease its volume. If desired, the glyphs 70 might be visible to the user without requiring the user to physically touch device 10 (e.g., glyphs 70 might be constantly illuminated or may be a persistent visible inked icon that does not require any illumination). This example in which glyphs 70 are used for speaker volume control is merely illustrative. In general, other types of glyphs for directing control circuitry 20 to skip to the next song, to fast forward, rewind, record, or otherwise control device 10 via physical touch may be implemented.

Figure 10A:
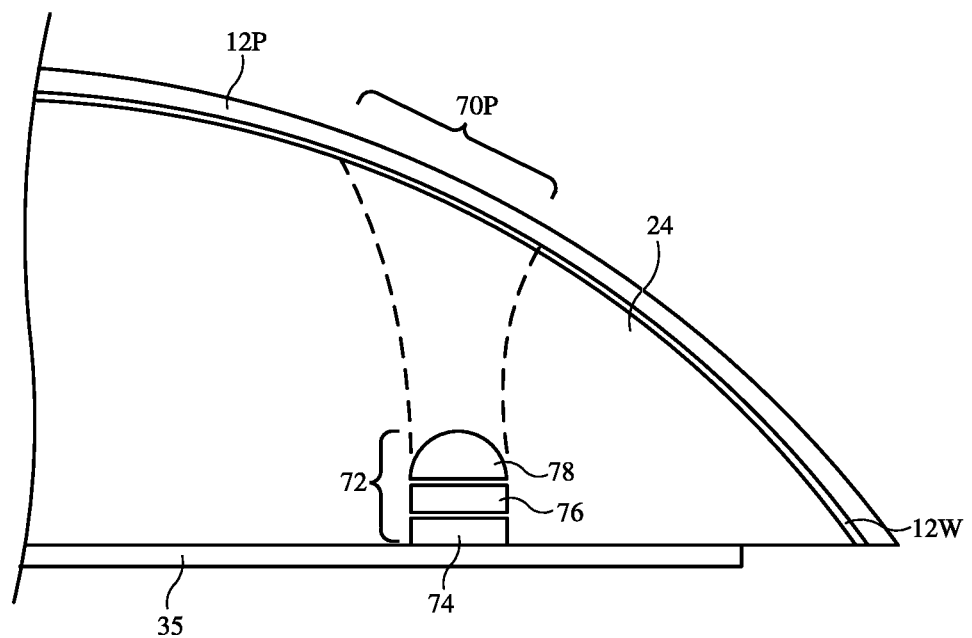
FIG. 10A is a cross-sectional side view of a portion of the device of FIG. 1 showing an illustrative glyph reticle projection assembly for outputting the indicator glyphs of FIG. 9 in accordance with an embodiment.

The glyphs may be illuminated in various ways. FIG. 10A is a cross-sectional side view of a portion of device 10 showing an illustrative glyph reticle projection assembly 72 configured to output the indicator glyphs of FIG. 9. As shown in FIG. 10A, glyph reticle projection assembly 72 may include a light-emitting component 74, a glyph reticle member 76 formed over the light-emitting component 74, and a reticle projection lens 78 formed over reticle member 76. The light-emitting component 74 within reticle projection assembly 72 is also mounted on printed circuit 35 and may be the same type of light-emitting component as components 34 that are used to illuminate the rest of top cap 12P or may be a different type of light-emitting component, such as a white LED. If desired, the reticle light-emitting component 74 may be larger or smaller than light-emitting component 34. Although not shown in FIG. 10A, an array of light-emitting components 34 are mounted on printed circuit 35 as shown in at least FIGS. 5 and 8.

Figure 10B:
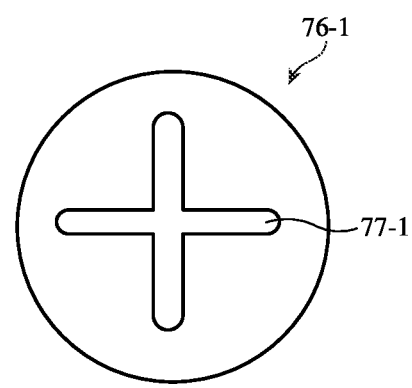
FIGS. 10B and 10C are top (plan) views of illustrative reticle components that may be used in the glyph reticle projection assembly of FIG. 10A in accordance with an embodiment.
Figure 10C:
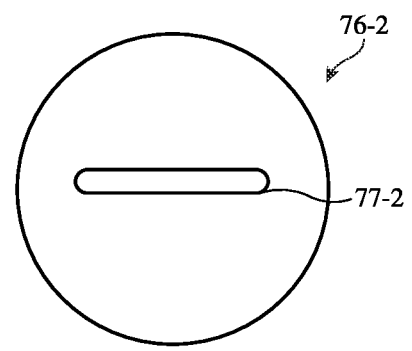

Reticle member 76 may be a stencil layer that is molded or machined from a layer of opaque polymer, metal, or other suitable non-transparent material. If desired, member 76 might also be formed from transparent material with a layer of black/opaque masking material patterned with the desired opening. FIGS. 10B and 10C are top (plan) views of illustrative reticle members that may be used in the glyph reticle projection assembly of FIG. 10A. In the example of FIG. 10B, reticle 76-1 may have a circular footprint and may have an opening 77-1 through which light emitted from the underlying light-emitting component 74 may travel. The size and shape of opening 77-1 may determine the resulting glyph 70 that is ultimately projected on the top surface of device 10. Reticle 76-1 of FIG. 10B may be used to create the + volume indictor shown in FIG. 9. In the example of FIG. 10C, reticle 76-2 may have a circular footprint and may have an opening 77-2 through which light emitted from the underlying light-emitting component 74 may travel. The size and shape of opening 77-2 may determine the resulting glyph 70 that is ultimately projected on the top surface of device 10. Reticle 76-2 of FIG. 10B may therefore be used to create the − volume indictor shown in FIG. 9. The actual circular footprint of reticle 76 is not crucial so long as the reticle/stencil opening has the desired size and shape. Reticle projection lens 78 may have be configured to project light traveling through reticle 76 towards the glyph display region 70P. Reticle projection lens 78 may be a solid lens member that is molded from clear polymer or other transparent material. Reticle projection assembly 72 may cast the desired glyph directly onto layer 12W. Layer 12W, which may be painted white, may serve as a suitable surface at which glyph 70 is projected with sufficient contrast.

Figure 11:
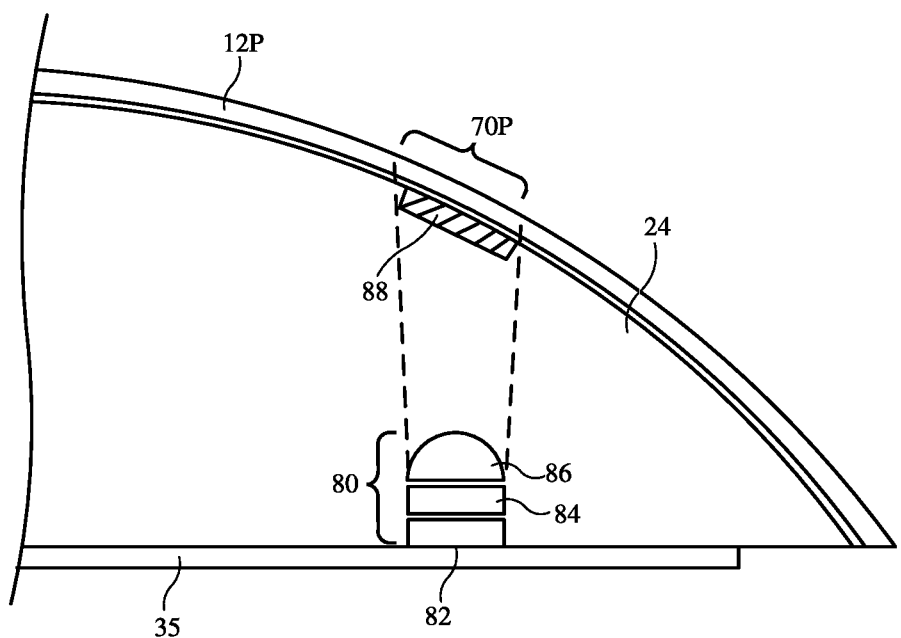
FIG. 11 is a cross-sectional side view of a portion of the device of FIG. 1 showing an illustrative glyph lighting assembly for illuminating a photoluminescent glyph in accordance with an embodiment.

The use of reticle projection assembly 72 to generate glyphs is merely illustrative. In another suitable arrangement, device 10 may be provided with a non-reticle based light projection assembly for projecting light onto a glyph-shaped material that lights up with sufficient contrast when shined with the projected light. FIG. 11 is a cross-sectional side view of a portion of device 10 showing an illustrative glyph lighting assembly 80 for illuminating a photoluminescent glyph 88. As shown in FIG. 11, glyph lighting assembly 80 may include a light-emitting component 82, a light guide member 84 formed over the light-emitting component 82, and a light projection lens 86 formed over light guide member 84. The light-emitting component 82 within assembly 80 is also mounted on printed circuit 35 and may be the same type of light-emitting component as components 34 that are used to illuminate the rest of top cap 12P or may be a different type of light-emitting component, such as an ultraviolet (UV) LED. If desired, the reticle light-emitting component 82 may be larger or smaller than light-emitting component 34.

Light guide member 84 may be configured to direct light upwards using the principle of total interval reflection (TIR) and may therefore sometimes be referred to as a TIR light guide. Light projection lens 86 may have be configured to project light output from light guide 84 towards the glyph display region 70P. Projection lens 86 may be a solid lens member that is molded from clear polymer or other transparent material. Glyph material 88 may be formed at the inner surface of top housing portion 12P and may be a patterned photoluminescent layer with the desired size and shape (e.g., glyph material 88 may have a +, −, or other suitable iconic shape when viewed from above as shown in FIG. 9). As an example, light projection assembly 80 may be configured to project ultraviolet (UV) light towards photoluminescent glyph material 88, which then causes material 88 to emit visible light to the user. If desired, glyph 88 may also be formed from phosphorescent, fluorescent, cathodoluminescent, or other types of photoluminescent material.

Figure 12A:
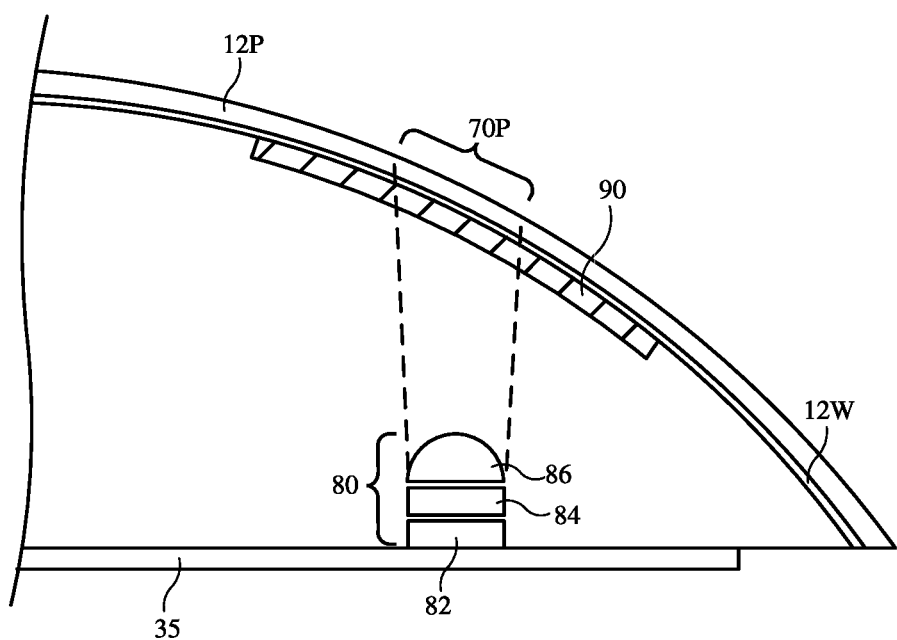
FIG. 12A is a cross-sectional side view of a portion of the device of FIG. 1 showing an illustrative glyph lighting assembly for illuminating a glyph opening in an opaque masking layer in accordance with an embodiment.
Figure 12B:
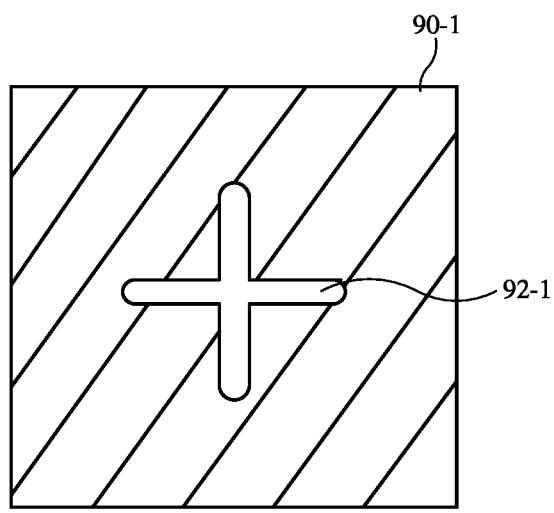
FIGS. 12B and 12C are top (plan) views of illustrative opaque masking layers that may be used in the device of FIG. 12A for outputting the indicator glyphs of FIG. 9 in accordance with an embodiment.
Figure 12C:
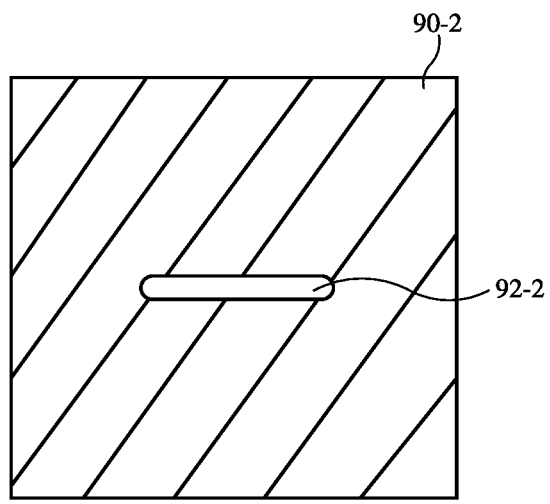

The use of a photoluminescent glyph layer shown in FIG. 11 is merely illustrative. In yet another suitable arrangement, the glyph may be displayed using an opaque masking layer 90 (e.g., a black mask layer) formed at the inner surface of the top cap portion 12P. FIG. 12A is a cross-sectional side view of a portion of device 10 showing glyph lighting assembly 80 being used to illuminate a glyph opening in an opaque masking layer 90. FIGS. 12B and 12C are top (plan) views of illustrative black masking layers that may be formed on the inside surface of the top cap portion (e.g., the opaque mask layer may be formed directly on the painted white layer 12W). In the example of FIG. 12B, black mask 90-1 may have an opening 92-1 through which light projected from assembly 80 may travel. Black mask 90-1 of FIG. 12B may therefore be used to create the + volume indictor shown in FIG. 9. In the example of FIG. 12C, black mask 90-2 may have an opening 92-2 through which light projected from assembly 80 may pass. Black masking layer 90-2 of FIG. 12C may therefore be used to create the − volume indictor shown in FIG. 9. Layer 90 may therefore sometimes be referred to as a black masking glyph layer. The actual footprint or outline of the black masking glyph layer is not crucial so long as the mask opening has the desired size and shape.

Figure 13:
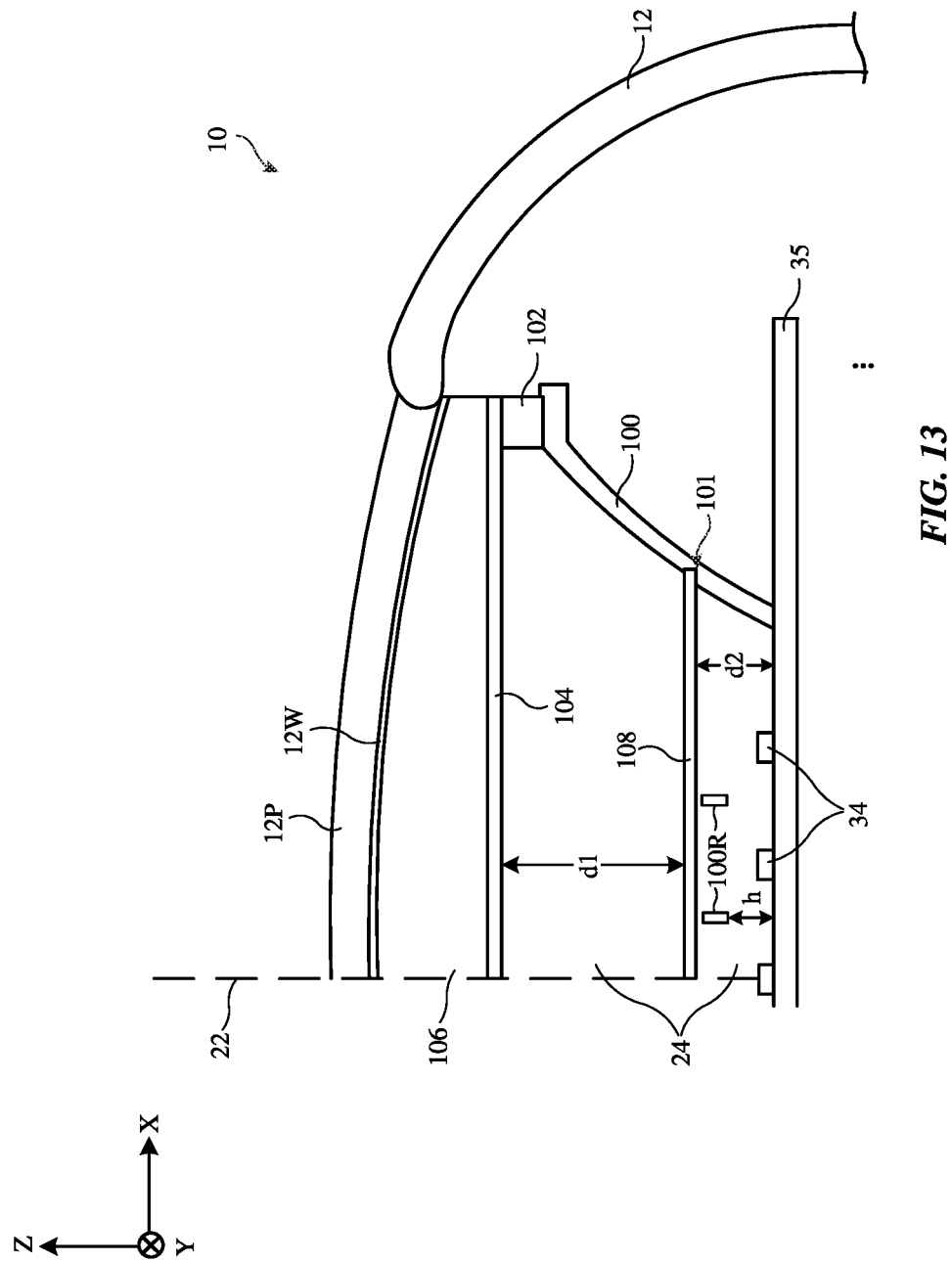
FIG. 13 is a cross-sectional side view of a portion of the device of FIG. 1 showing an illustrative support structure configured to suspend a diffuser layer over a planar array of light-emitting components in accordance with an embodiment.

The examples of FIGS. 3-12 in which the top cap portion 12P has a hemispherical or dome shape is merely illustrative. In yet other suitable embodiments, the top cap portion 12P may have a curved profile but may resemble a flatter disk shape as shown in FIG. 13. White layer 12W may be formed at the inner surface of portion 12P. Although not explicitly shown, a color adjustment layer 12C may optionally be interposed between top cap cover layer 12P and white layer 12W to adjust the tint of portion 12P. A touch sensor may be formed under top cap portion 12P. For example, a two-dimensional capacitive touch sensor such as touch sensor 104 may be formed from an array of capacitive touch sensor electrodes that are overlapped by portion 12P. Capacitive touch sensor circuitry may be coupled to the touch sensor electrodes and may gather user touch input through portion 12P. The capacitive touch sensor electrodes may be formed on a touch sensor substrate or other supporting structure. Capacitive touch sensor electrodes may be formed from conductive material such as metal, transparent conductive material such as indium tin oxide, or other conductive materials such as Ag nanowires. A touch window layer such as touch window layer 106 may be interposed between the top cap portion 12P and touch sensor 104. Touch window 106 may be formed from clear polymer or other transparent material. The touch window may therefore sometimes be referred to as a clear polymer layer.

An array of light-emitting components 34 may be formed on printed circuit 35 underneath portion 12P. A support structure such as diffuser support structure 100 may be formed around and over the array of light-emitting components 34. Support structure 100 may have a base portion that completely surrounds the array of light-emitting components 34. Support structure 100 may be a solid molded (and/or machined) member formed from polymer, metal, or other suitable material. Structure 100 may generally be formed from opaque material with low light transmissivity. Touch sensor 104 may be bolstered on structure 100 by an additional support member 102. Support member 102 may be a ring-shaped foam member (when viewed in direction Z) or may be formed from other soft, absorptive, or rigid support material.

Support structure 100 may also be configured to suspend a light diffuser layer 108 over the array of light-emitting components. Support structure 100 may have a ledge portion 101 for receiving disk-shaped diffuser layer 108 (as an example). In one suitable arrangement, diffuser layer 108 may have a flat bottom surface and a curved top surface. In another suitable arrangement, diffuser layer 108 may have curved bottom and top surfaces. In yet another suitable arrangement, diffuser layer 108 may have flat bottom and top surfaces. Diffuser layer 108 may be configured to diffuse, scatter, mix, and/or otherwise homogenize the light that is emitted from the array of light-emitting components 34. Layer 108 may be a polymer layer or other substrate that is optionally coated with textured coating layer(s) (e.g., with textured structures such as pyramidal structures, spherical structures, conical structures, frustoconical structures, ridges, and/or other protrusions, and/or grooves, pits, or other depressions to help scatter light). Layer 108 may optionally contain light-scattering structures embedded in glass, polymer, or other transparent material. The light-scattering structures may include voids (e.g., vacuum-filled cavities, gas-filled cavities such as air bubbles, cavities filled with nitrogen or other inert gases, etc.) and/or may include light scattering particles with different refractive index values as the transparent material. The light-scattering particles may include, for example, titanium dioxide particles or other particles of inorganic dielectric.

Air gaps 24 may separate touch sensor 104 and diffuser layer 108 and may also separate diffuser layer 108 and printed circuit 35. The presence of air gaps 24 may help promote light mixing. For example, a vertical gap distance d1 between the touch layer and the diffuser layer and/or the thickness of the diffuser layer may be tuned to optimize for light and color uniformity across the surface of portion 12P. If desired, a vertical gap distance d2 between PCB 35 and the diffuser layer may also be tuned to optimize for light and color uniformity across the surface of portion 12P. If desired, one or more additional light diffusing or scattering layers may be disposed in the air gap between layers 104 and 108 and/or in the air gap between layers 108 and 34 to further homogenize emitted light, reduce undesired optical artifacts, and reduce hotspots on top caption portion 12P.

Diffuser support structure 100 may further include ring (or rib) portions 100R that are suspended over the region between adjacent light-emitting components 34. The ring portions 100R may be configured as light baffle members to help constrain the angular spread of light emitted from components 34. The height h of the ribs 100R over PCB 35 may also be tuned to optimize for light and color uniformity across the surface of portion 12P. The outer boundary of support structure 100 that surrounds components 34 (e.g., the lateral distance between the outermost component 34 and the base of the support structure, the overall height of the support structure, the angle at which support structure flares outwards, etc.) may control the luminance roll-off profile on the surface of portion 12P.

Figure 14:
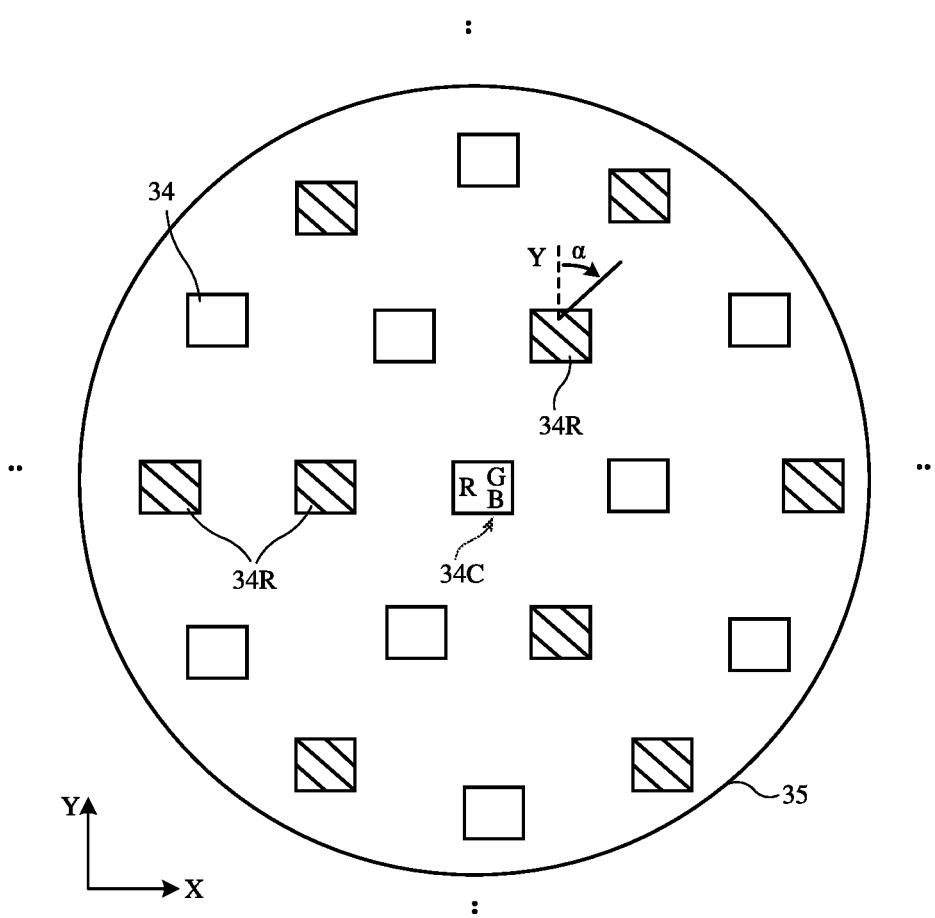
FIG. 14 is a top (plan) view of the planar array of light-emitting components of FIG. 13 showing how at least some light-emitting components in the array can be rotated for improved color balance in accordance with an embodiment.

FIG. 14 is a top (plan) view of the array of light-emitting components 34 mounted on printed circuit 35. Printed circuit board 35 may have an overall circular outline but may alternatively have an oval/elliptical footprint, a rectangular footprint, a triangular footprint, a diamond-shaped footprint, a pentagonal footprint, a hexagonal footprint, or other desired symmetrical or asymmetrical outlines. Any suitable pattern of light-emitting components 34 may be distributed across the surface of PCB 35. The distance between each adjacent pair of light-emitting components 34 may be equal or different. FIG. 14 shows 19 total light-emitting components as part of the visual feedback light-emitting device but this is merely illustrative. If desired, printed circuit 35 may be provided with 10-20 light-emitting components (diodes or lasers), less than 10 light-emitting components (diodes or lasers), 20-30 light-emitting components (diodes or lasers), more than 30 light-emitting components (diodes or lasers), or any suitable number of light-emitting components (diodes or lasers).

In some configurations, all of the light-emitting components 34 on the printed circuit 35 may be oriented in the same way. As described above, each light-emitting component 34 may include a red (R) subcomponent, a green (G) subcomponent, and a blue (B) subcomponent. If care is not taken, the light-emitting components may generate a visual output that is not color balanced. For instance, if all the light-emitting components 34 are oriented in the same way as the center light-emitting component 34C (where the red subcomponent is always facing west), then then the visual output may have a more reddish bias towards the west.

To improve color balance, at least some of the light-emitting components 34 in the array may be rotated by an angle α with respect to the Y axis. In one suitable arrangement, every other light-emitting component may be rotated by an angle α that is equal to 90°, 180°, 270°, 45°, 60°, 120°, 225°, 315°, or other suitable angle. For instance in the arrangement of FIG. 14, the center diode 34C may have a given nominal orientation while every other diode in the inner ring surrounding the center diode 34C may be rotated by an angle α=180° relative to the given nominal orientation and while every other diode in the outer ring surrounding the inner ring may also be rotated by an α=180° relative to the given nominal orientation (see rotated components 34R that are shaded in FIG. 14). By rotating at least some subset of the light-emitting components while keeping others oriented in the same way as the center diode 34C, improved color balance may be achieved. In yet another suitable arrangement, different groups of light-emitting components may be rotated by different respective amounts. For example, components 34 located along the 1 o'clock position might be rotated by an angle α=30°, whereas components 34 located along the 5 o'clock position might be rotated by an angle α=150°.

Figure 15A:
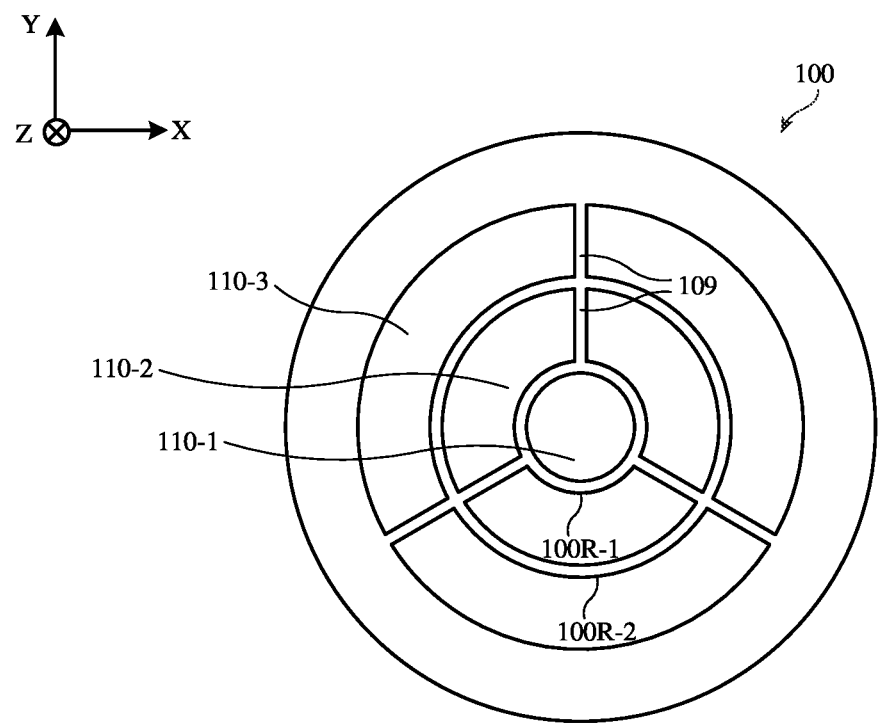
FIG. 15A is a top (plan) view showing one suitable arrangement of the support structure of FIG. 13 having baffle members separating an opening in the support structure into three concentric zones in accordance with an embodiment.

FIG. 15A is a top (plan) view showing one suitable arrangement of diffuser support structure 100 having two ring-shaped rib portions 100R (sometimes also referred to as baffle members). The innermost baffle member 100R-1 may surround a central region 110-1 through which a first group of light-emitting components may emit light in the Z direction. The next outer baffle member 100R-2 that surrounds the innermost baffle member may form an intermediate region 110-2 through which a second group of light-emitting components may emit light. The outermost boundary or border of structure 100 that surrounds baffle member 100R-2 may form an outer region 110-3 through which a third group of light-emitting components may emit light. Radially extending arm portions 109 may connect the boundary member to each successive baffle ring member to provide mechanical support for the baffles. In the example of FIG. 15A, three arm portions 109 are shown, which is merely illustrative. If desired, support structure 100 might include only one arm portion, only two arm portions, or more than three arm portions.

Figure 15B:
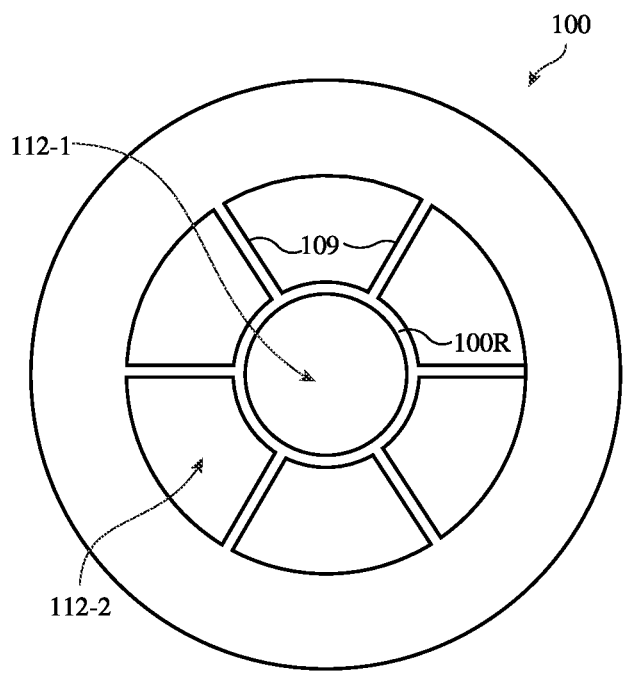
FIG. 15B is a top (plan) view showing another suitable arrangement of the support structure of FIG. 13 having baffle members separating an opening in the support structure into two concentric zones in accordance with an embodiment.

In another suitable arrangement, diffuser support structure 100 may have six radially-extending arm portions (see, e.g., FIG. 15B). FIG. 15B is a top (plan) view showing diffuser support structure 100 having only one ring-shaped rib (baffle member) portion 100R supported by six arm members 109. The inner ring 100R may surround a central region 112-1 through which a first group of light-emitting components may emit light in the Z direction. The outermost boundary or border of structure 100 that surrounds ring 100R may form an outer region 112-2 through which a second group of light-emitting components may emit light. If desired, structure 100 may in general may any desired number of ring-shaped rib portions (e.g., structure 100 might include only one rib member as shown in FIG. 15B, two rib members as shown in FIG. 15A, three or more rib members, 3-10 rib members, etc.) each of which is support by any suitable number of arms.

Figure 16A:
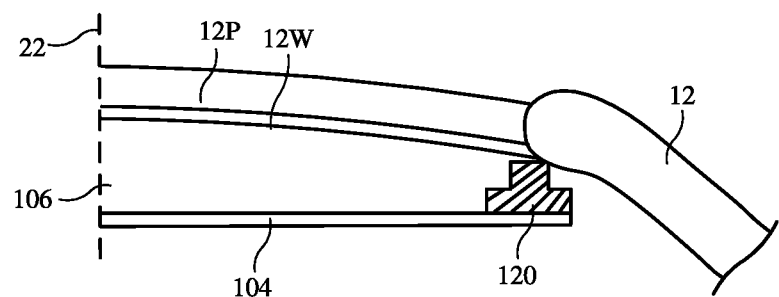
FIG. 16A is a cross-sectional side view of a portion of the device of FIG. 1 showing a dark support member at the edge of a clear window in accordance with an embodiment.
Figure 16B:
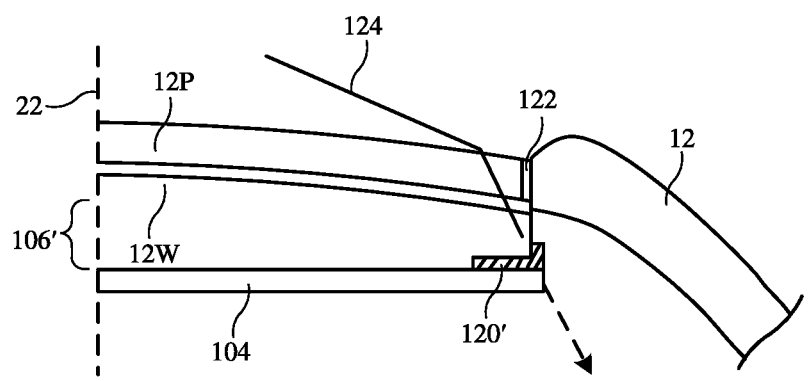
FIG. 16B is a cross-sectional side view of a portion of the device of FIG. 1 showing a top cap with a white edge and a clear window with a deeper edge in accordance with an embodiment.

Structures formed near the edge of top cap portion 12P connecting portion 12P to housing 12 may affect how the peripheral edge of portion 12P appears to the user. If care is not taken, the user may detect unpleasing edge artifacts. FIG. 16A is a cross-sectional side view of a portion of device 10 showing a dark support member 120 at the edge of the clear touch window 106. Use of dark support member 120 at the edge of touch window 106 may produce an undesirable visible dark band along the border of the top cap portion to the user. FIG. 16B shows another suitable arrangement in which the peripheral edge of top cap portion 12P is painted white (see white coating layer 122). Painting the lateral edge of top cap 12P white or otherwise coating the top cap edge with a lighter or reflective material in this way can help reduce the dark edge banding effect. In the embodiment of FIG. 16B, the thickness of the support member 120' is also reduced, which increases the depth of the clear touch window 106'. Increasing the depth of the touch window 106' in this way allows support member 120' to be less visible from user oblique viewing angle with ray path 124, helping to mitigate the appearance of dark edge banding phenomenon. If care is not taken, providing the top cap portion with a white edge and increasing the depth of the clear touch window at its edge may produce an undesirable visible bright edge along the border of the top cap portion to the user.

Figure 16C:
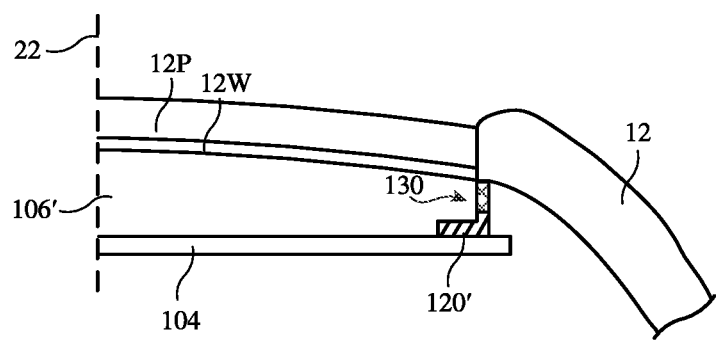
FIG. 16C is a cross-sectional side view of a portion of the device of FIG. 1 showing a clear window with a dark edge coating in accordance with an embodiment.

FIG. 16C is a cross-sectional side view of a portion of device 10 showing how the clear touch window may be provided with a dark edge coating. As shown in FIG. 16C, a black ink layer 130 may coat the lateral edge of touch window 106'. Similar to FIG. 16B, the thickness of support member 120' may be reduced to accommodate a bigger and deeper touch window. Increasing the depth of the touch window 106' in this way allows support member 120' to be less visible from user oblique viewing angle with ray path 124, helping to mitigate the appearance of dark edge banding phenomenon. Because of refraction, black ink layer 130 does not contribute to dark edge banding as ray path 124 does not intersect black ink layer 130. Unlike FIG. 16B, the use of black ink coating 130 or other suitable dark film layer formed on the vertical peripheral edge of the touch window may help block any undesired light leakage to prevent bright edge effects.

Figure 16D:
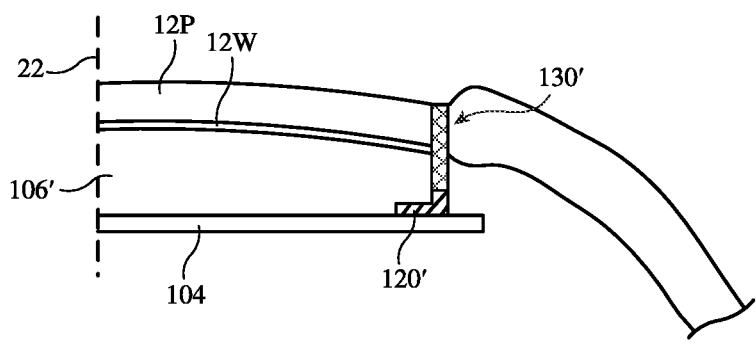
FIG. 16D is a cross-sectional side view of a portion of the device of FIG. 1 showing a top cap and clear window both having a dark edge coating in accordance with an embodiment.

FIG. 16D is a cross-sectional side view of a portion of device 10 showing how the both clear touch window and the top cap portion may be provided with a dark edge coating. As shown in FIG. 16D, a black ink layer 130' may coat the lateral edge of touch window 106' and top cap portion 12P. Similar to FIG. 16B and FIG. 16C, the thickness of support member 120' may be reduced to accommodate a bigger and deeper touch window, which helps mitigate the dark edge banding phenomenon. Like FIG. 16C, the use of black ink coating 130' or other suitable dark film/coating layer formed on the vertical peripheral edge of the touch window and/or the top cap portion may help absorb any undesired like leakage to eliminate undesired bright edge effects.

Figure 17A:
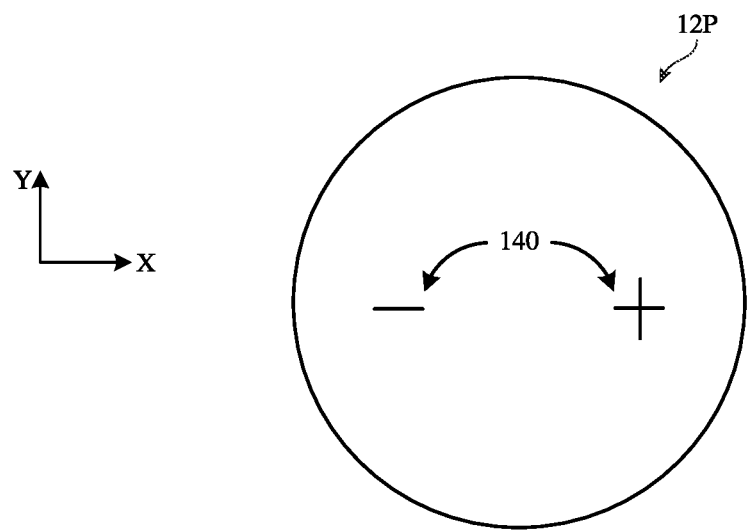
FIG. 17A is top view of a top cap showing illustrative indicator glyphs in accordance with an embodiment.

FIG. 17A shows a top view of top cap portion 12P when viewed in the Z direction. As shown in FIG. 17A, alphanumeric letters or other symbols/icons (sometimes referred to as glyphs) such as "+" and "−" volume indicator glyphs 140 may be visible on the top cap portion 12P. In one suitable arrangement, glyphs 140 might be formed in the same region as the swirling pattern that is output to the user during confirmation of receipt of a voice command (e.g., glyphs 140 may be displayed in the top cap region 12P as shown in FIG. 17A). In other suitable arrangements, glyphs 140 might be visible in a region that is separate from the top cap region (e.g., glyphs 140 might be displayed in a region that is outside the border of the top cap portion 12P). When the user presses on the region where the + glyph is located, control circuitry 20 may direct the speaker(s) within device 10 to increase its volume. When the user presses on the region where the − glyph is located, control circuitry 20 may direct the speaker(s) within device 10 to decrease its volume.

Glyphs 140 might be visible to the user without requiring the user to physically touch device 10 (e.g., glyphs 140 might be constantly illuminated or may be a persistent visible inked icon that does not require any light to be projected from below the top cap). Alternatively, glyphs 140 may be occasionally illuminated using a reticle projection assembly of the type described in connection with FIG. 10A, using a light projection assembly to illuminate a photoluminescent glyph layer as described in connection with FIG. 11, using a light projection assembly to illuminate an opening in a black mask layer as described in connection with FIG. 12A, or via other glyph illumination mechanisms in response to a user's physical touch. This example in which glyphs 140 are used for speaker volume control is merely illustrative. In general, other types of glyphs for directing control circuitry 20 to skip to the next song, to fast forward, rewind, record, or otherwise control device 10 via physical feedback may be implemented.

Figure 17B:
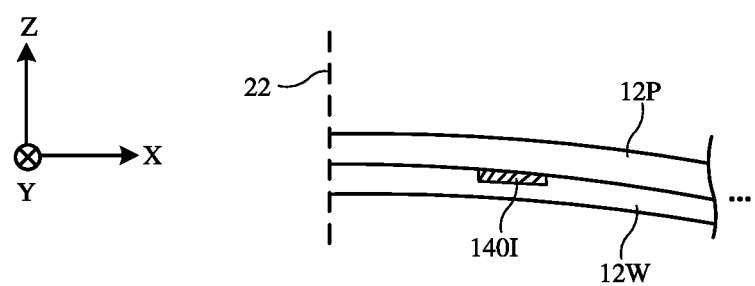
FIG. 17B is a cross-sectional side view of the top cap of FIG. 17A showing how a glyph ink layer may be interposed between the top cap and a white painted layer in accordance with an embodiment.
Figure 17C:
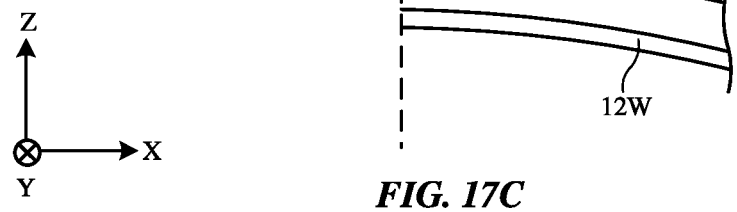
FIG. 17C is a cross-sectional side view of the top cap of FIG. 17A showing how a glyph ink layer may be formed directly on the top cap in accordance with an embodiment.

Configurations in which glyphs 140 are formed as a persistent visible icon on the top cap portion are sometimes described herein as an examples. FIG. 17B is a cross-sectional side view of portion 12P showing how a glyph ink layer 140I may be interposed between top cap 12P and white painted layer 12W. Ink layer 140I may be a patterned black ink layer or may be formed using any dark or opaque material that can be patterned into the desired glyph shape and/or provide sufficient contrast against the white layer 12W when viewed through top cap 12P. FIG. 17C illustrates another suitable arrangement in which glyph ink layer 140P is formed directly on the top surface of top cap portion 12P. Ink layer 140P may be a patterned black ink layer or may formed using any dark or opaque material that can be patterned into the desired glyph shape and/or provide sufficient contrast against the top cap 12P in plain view. These examples in which glyphs 140 are formed using dark or opaque material against a lighter backdrop so black glyphs are visible on a white or light gray top cap is merely illustrative. If desired, glyphs 140 might be formed using white ink or other lighter material against a comparatively darker backdrop so that one or more white glyphs are visible on a black or dark gray tinted top cap.

Device 10 may be operated in a system that uses personally identifiable information. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to have control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An electronic device, comprising:
   a housing;
   a speaker in the housing configured to emit sound;
   light-emitting components configured to emit light through a portion of the housing; and
   a support structure that surrounds the light-emitting components, wherein the support structure includes at least one baffle member suspended over a region between at least two of the light-emitting components and configured to control an angular spread of the light emitted from the light-emitting components.

2. The electronic device of claim 1, wherein the housing is spherical and has a top and wherein the portion of the housing comprises a housing wall on the top.

3. The electronic device of claim 2, wherein the light-emitting components comprise light-emitting components selected from the group consisting of light-emitting diodes and lasers.

4. The electronic device of claim 1, wherein the at least one baffle member comprises a ring-shaped member.

5. The electronic device of claim 1, wherein the support structure further includes an additional baffle member attached to the at least one baffle member via an arm member.

6. The electronic device of claim 1, further comprising a diffuser layer mounted on the support structure.

7. The electronic device of claim 6, wherein the diffuser layer is above the at least one baffle member.

8. The electronic device of claim 6, further comprising a touch sensor between the diffuser layer and the portion of the housing.

9. The electronic device of claim 8, wherein the touch sensor and the diffuser layer are separated by an air gap.

10. The electronic device of claim 8, further comprising a clear window layer between the touch sensor and the portion of the housing.

11. The electronic device of claim 10, wherein the portion of the housing has a peripheral edge covered by a white coating layer.

12. The electronic device of claim 10, wherein the clear window layer has a peripheral edge covered by a black coating layer.

13. The electronic device of claim 12, wherein the portion of the housing has a peripheral edge covered by the black coating layer.

14. The electronic device of claim 1, wherein the light-emitting components are mounted on a planar substrate.

15. The electronic device of claim 14, wherein a first subset of the light-emitting components have a given orientation on the planar substrate and wherein a second subset of the light-emitting components are rotated by an angle with respect to the given orientation.

16. The electronic device of claim 15, wherein the angle of rotation is equal to 90° or 180°.

17. The electronic device of claim 1, further comprising glyph layer formed at a top surface of the portion or at a bottom surface of the portion.

18. An electronic device, comprising:
a housing;
light-emitting components overlapped by a top portion of the housing; and
an opaque support structure between the light-emitting components and the top portion of the housing, wherein the opaque support structure comprises a ring-shaped rib member and a radially-extending arm member configured to control an angle of light emitted from the light-emitting components.

19. The electronic device of claim 18, wherein the opaque support structure further comprises an additional ring-shaped rib member surrounding the ring-shaped rib member and wherein the ring-shaped rib member and the additional ring-shaped rib member are joined by the radially-extending arm member.

20. The electronic device of claim 18, further comprising a light diffuser layer mounted on the opaque support structure over the ring-shaped rib member.

21. An electronic device, comprising:
a housing with a top cap portion;
a light-emitting device configured to emit light through the top cap portion;
a touch sensor between the light-emitting device and the top cap portion;
a clear polymer layer between the touch sensor and the top cap portion; and
a black ink layer formed along a side wall of the clear polymer layer.

22. The electronic device of claim 21, wherein the black ink layer is also formed along a side wall of the top cap portion.

* * * * *